(12) United States Patent
Garg

(10) Patent No.: US 10,944,394 B2
(45) Date of Patent: Mar. 9, 2021

(54) METHODS AND APPARATUS TO REDUCE LEAKAGE CURRENT

(71) Applicant: Texas Instruments Incorporated, Dallas, TX (US)

(72) Inventor: Mayank Garg, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/360,914

(22) Filed: Mar. 21, 2019

(65) Prior Publication Data

US 2020/0076419 A1 Mar. 5, 2020

Related U.S. Application Data

(60) Provisional application No. 62/727,233, filed on Sep. 5, 2018.

(51) Int. Cl.
| | |
|---|---|
| *H03K 17/16* | (2006.01) |
| *H03K 17/082* | (2006.01) |
| *H01L 27/06* | (2006.01) |
| *H01L 27/02* | (2006.01) |
| *H01L 29/207* | (2006.01) |
| *H01L 29/167* | (2006.01) |
| *H01L 29/06* | (2006.01) |

(52) U.S. Cl.
CPC ....... *H03K 17/165* (2013.01); *H01L 27/0255* (2013.01); *H01L 27/0277* (2013.01); *H01L 27/0629* (2013.01); *H03K 17/0822* (2013.01); *H01L 29/0684* (2013.01); *H01L 29/167* (2013.01); *H01L 29/207* (2013.01)

(58) Field of Classification Search
CPC .. H03K 17/08; H03K 17/082; H03K 17/0822; H03K 17/16; H03K 17/161; H03K 17/165
See application file for complete search history.

(56) References Cited

U.S. PATENT DOCUMENTS

| | | | |
|---|---|---|---|
| 2010/0295618 A1* | 11/2010 | Ide ...................... | H03F 3/45183 330/257 |
| 2014/0145726 A1* | 5/2014 | Chang .................. | G01R 31/025 324/503 |
| 2016/0173072 A1* | 6/2016 | Taghivand ........... | H03H 11/245 327/321 |

* cited by examiner

*Primary Examiner* — Diana J. Cheng
(74) *Attorney, Agent, or Firm* — Michelle F. Murray; Charles A. Brill; Frank D. Cimino

(57) ABSTRACT

Methods, apparatus, systems and articles of manufacture are disclosed that provide an apparatus comprising: a first transistor including a first gate, a first current terminal, and a second current terminal; a second transistor including a second gate, a third current terminal, and a fourth current terminal; the first current terminal coupled to the third current terminal; the first gate coupled to the second gate and the second current terminal; a third transistor including a third gate, a fifth current terminal, and a sixth current terminal, the fifth current terminal coupled to the second current terminal, third gate coupled to a voltage reference node; and a fourth transistor including a fourth gate, a seventh current terminal and an eighth current terminal, the seventh current terminal coupled to the sixth current terminal, the fourth gate coupled to the seventh current terminal and the eighth current terminal coupled to the fourth current terminal.

20 Claims, 9 Drawing Sheets

US 10,944,394 B2

METHODS AND APPARATUS TO REDUCE LEAKAGE CURRENT

RELATED APPLICATION

This patent claims the benefit of U.S. Provisional Application Ser. No. 62/727,233 which was filed on Sep. 5, 2018. U.S. Provisional Application Ser. No. 62/727,233 is hereby incorporated herein by reference in its entirety. Priority to U.S. Provisional Application Ser. No. 62/727,233 is hereby claimed.

FIELD OF THE DISCLOSURE

This disclosure relates generally to gate drivers, and, more particularly, to methods and apparatus to reduce leakage current in parasitic transistors.

BACKGROUND

High-voltage and/or high-current application require power electronic devices capable of efficient and effective operation at elevated temperatures. In such applications, power modules provide the required power using power metal-oxide-semiconductor field-effect transistors (MOSFETs). The power MOSFETs may be used as power delivering devices to support tens or hundreds of amperes during normal operation to deliver the power to a load.

Figure 1:
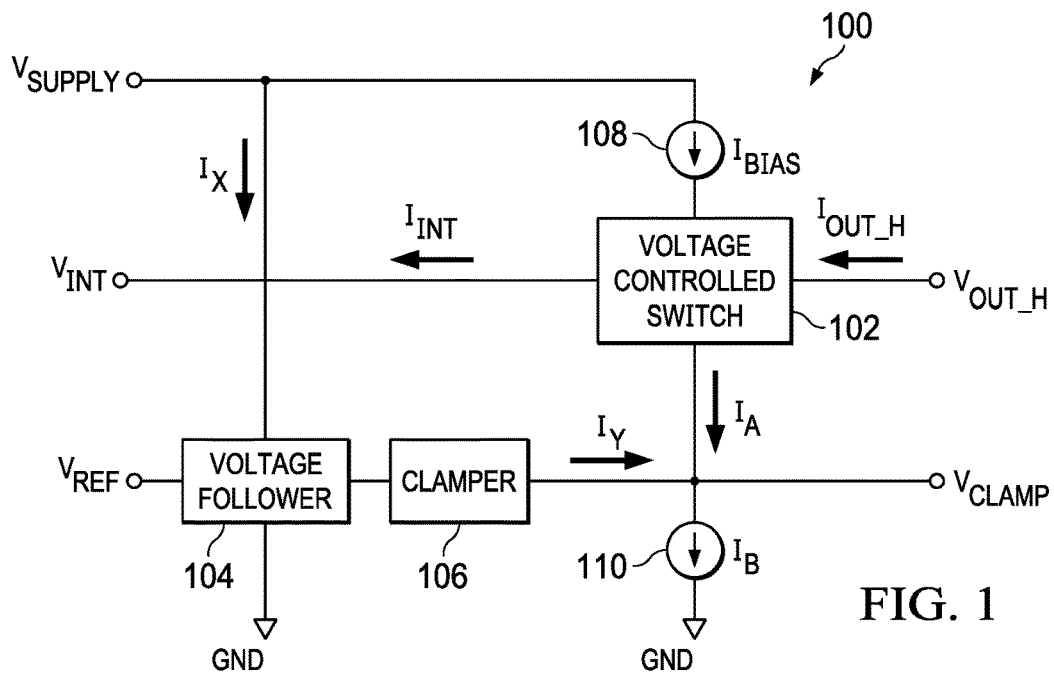
FIG. 1 is a block diagram of an example clamping circuit.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

High-voltage and/or high-current isolated gate driver environments and applications, such as a traction inverter in an electric vehicle (EV), a hybrid-electric vehicle (HEV), etc., require power electronic devices capable of efficient and effective operation at elevated temperatures. Power delivery and/or management modules have been developed to provide the required power using low-impedance power MOSFETs made from Silicon Carbide (SiC). The power SiC MOSFETs may be used as power delivering devices to support tens or hundreds of amperes during normal operation to deliver the power to a load. Alternatively, power modules have been developed using low impedance isolated gate bipolar transistor (IGBT) devices to satisfy the necessary power requirements for applications such as traction inverters for EVs, HEVs, etc.

In such high-power applications, parasitic diodes in high voltage laterally diffused metal-oxide-semiconductor field-effect transistors (LDMOSFETs) and drain-extended metal-oxide-semiconductor field-effect transistors (DEMOSFETs) are typically used as voltage clamps for protecting integrated circuits in which the LDMOSFETs and DEMOSFETs are included. In LDMOSFETs and DEMOSFETs, the current flows through the back-gate-to-drain parasitic diode. In LDMOSFETs and DEMOSFETs, the back-gate-to-drain parasitic diode and a drain-to-substrate parasitic diodes form a parasitic positive-negative-positive (PNP) bipolar junction transistor (BJT).

When the back-gate-to-drain parasitic diode is conducting current, a large leakage current passes through the drain-to-substrate parasitic diode. This leakage current is magnified by the gain of the parasitic PNP BJT (β). If the current level through the parasitic PNP BJT is high and proper guard rings (e.g., an equipotential conductor surrounding a terminal of a semiconductor that is used to prevent parasitic devices from forming) are not used, any negatively doped region near the parasitic PNP BJT can form a drain-to-substrate to the negatively doped region parasitic negative-positive-negative (NPN) BJT. The leakage through the parasitic PNP BJT and the parasitic NPN BJT can cause the LDMOSFETs and DEMOSFETs in which the parasitic BJTs exist to operate as a logic latch. Operation as a logic latch is referred to herein as a latch-up event. Such latch-up events can cause a short circuit or lead to other harmful effects such as thermal runaway that damage and/or destroy the LDMOSFETs and DEMOSFETs in use. If a LDMOSFET and/or DEMOSFET experiences a latch-up event, the circuitry that the LDMOSFET and/or the DEMOSFET is being used to clamp the voltage level of will no longer be clamped and can lead to further damage in the residual circuitry.

Examples disclosed herein provide a feedback circuit to reduce leakage current in parasitic transistors. The examples disclosed herein provide an apparatus comprising: a first transistor including a first gate, a first current terminal, and a second current terminal; a second transistor including a second gate, a third current terminal, and a fourth current terminal; the first current terminal coupled to the third current terminal; the first gate coupled to the second gate and the second current terminal; a third transistor including a third gate, a fifth current terminal, and a sixth current terminal, the fifth current terminal coupled to the second current terminal, third gate coupled to a voltage reference node; and a fourth transistor including a fourth gate, a seventh current terminal and an eighth current terminal, the seventh current terminal coupled to the sixth current terminal, the fourth gate coupled to the seventh current terminal and the eighth current terminal coupled to the fourth current terminal.

The example methods, apparatus, and articles of manufacture disclosed herein provide a current sensor to sense a first current, the first current related to a leakage current caused by a parasitic component and current multiplier to generate a second current proportional by a ratio to the first current, the third current to reduce the leakage current caused by the parasitic component.

FIG. 1 is a block diagram of an example clamping circuit 100. The clamping circuit 100 includes an example voltage-controlled switch 102, an example voltage follower 104, an example clamper 106, an example biasing current source 108 ($I_{BIAS}$), and an example current source 110 ($I_B$), The example clamping circuit 100 additionally includes an example first voltage node ($V_{SUPPLY}$) (e.g., a voltage supply node), an example second voltage node ($V_{OUT\_H}$) (e.g., a voltage supply node), and an example third voltage node ($V_{INT}$) (e.g., a voltage supply node). The example clamping circuit 100 also includes an example fourth voltage node ($V_{REF}$) (e.g., a voltage reference node), an example fifth voltage node ($V_{CLAMP}$) (e.g., a voltage supply node), and an example sixth voltage node (GND).

In the illustrated example of FIG. 1, the example voltage-controlled switch 102 is coupled to the biasing current source 108 $I_{BIAS}$, the second voltage node $V_{OUT\_H}$, the third voltage node $V_{INT}$, and the fifth voltage node $V_{CLAMP}$. In the illustrated example, the example voltage follower 104 is coupled to the first voltage node $V_{SUPPLY}$, the fourth voltage node $V_{REF}$, the example clamper 106, and the sixth voltage node GND. The example clamper 106 is coupled to the fifth voltage node $V_{CLAMP}$ and the example voltage follower 104. The example biasing current source 108 $I_{BIAS}$ is coupled to the first voltage node $V_{SUPPLY}$ and the example voltage-controlled switch 102. The example current source 110 $I_B$ is coupled to the example fifth voltage node $V_{CLAMP}$ and the sixth voltage node GND.

In the illustrated example of FIG. 1, the first voltage node $V_{SUPPLY}$ is a voltage node connected to a voltage source. The voltage source provides a source of power to the clamping circuit 100. In the illustrated example, the second voltage node $V_{OUT\_H}$ is a voltage node at which one or more devices are to be coupled to the clamping circuit 100. Example devices include integrated circuits (ICs), IGBTs, MOSFETs, BJTs, junction-gate field-effect transistors (JFETs), and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the illustrated example of FIG. 1, the third voltage node $V_{INT}$ is a voltage node at which one or more devices are to be coupled to the clamping circuit 100. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements. As used herein, high-impedance refers to any impedance value sufficiently large enough (e.g., $10^{13}\Omega$, 100 MΩ, 10 MΩ, etc.) to reduce the magnitude of a second current ($I_{INT}$) flowing between the example voltage-controlled switch 102 and the third voltage node $V_{INT}$ to be sufficiently low (e.g., on the scale of milliamps, on the scale of microamps, on the scale of nanoamps, etc.).

In the illustrated example of FIG. 1, the voltage-controlled switch 102 is an electrical switch that controls conduction between the second voltage node $V_{OUT\_H}$ and the fifth voltage node $V_{CLAMP}$. In some examples, the voltage-controlled switch 102 is a parasitic body diode of a transistor. In other examples, the voltage-controlled switch 102 is a transistor, in further examples, the voltage-controlled switch 102 is a combination of a transistor and the parasitic body diode of the transistor. In the illustrated example, the voltage-controlled switch 102 is controlled by a voltage drop between a first voltage level at the biasing current source 108 $I_{BIAS}$ and a second voltage level at the fifth voltage node $V_{CLAMP}$. In the illustrated example, the current flowing between the example voltage-controlled switch 102 and the fifth voltage node $V_{CLAMP}$ is a third current IA.

In the illustrated example of FIG. 1, the fourth voltage node $V_{REF}$ is a voltage node at which a voltage level is applied. The voltage level is a reference voltage level for a desired voltage level at the fifth voltage node $V_{CLAMP}$. In the illustrated example of FIG. 1, the example voltage follower 104 is a circuit that isolates the fourth voltage node $V_{REF}$ from the other elements of the clamping circuit 100. The current flowing between the first voltage node $V_{SUPPLY}$ and the example voltage follower 104 is a fourth current $I_X$.

In the illustrated example of FIG. 1, the example clamper 106 is a circuit that clamps a voltage node to a desired voltage level. In some examples, the clamper 106 is a combination of a MOSFET and a parasitic component such as a diode. In other examples, the clamper is a diode, such as a Schottky diode. The current flowing from the clamper 106 to the fifth voltage node $V_{CLAMP}$ is a fifth current $I_Y$. The clamper 106 clamps the voltage level at a voltage node when the voltage exceeds/is below a threshold value. The clamper 106 clamps the voltage level at the fifth voltage node $V_{CLAMP}$ to protect the voltage-controlled switch 102 and therefore to ensure proper functionality of the one or more devices coupled to the voltage-controlled switch 102.

For example, when the voltage-controlled switch 102 is coupled to a gate of an IGBT at the second voltage node $V_{OUT\_H}$, the voltage level at the second voltage node $V_{OUT\_H}$ varies to control the IGBT. In such an example, if the voltage level at the second voltage node $V_{OUT\_H}$ goes above/below a threshold value, the voltage-controlled switch 102 is disabled. If the voltage-controlled switch 102 is disabled (e.g., abruptly disabled), one or more devices coupled to the third voltage node $V_{INT}$ may experience transient voltage and current events that may damage and/or destroy the voltage-controlled switch 102 and/or the one or more devices coupled to the third voltage node $V_{INT}$. Therefore, it is advantageous to clamp the voltage level that controls the voltage-controlled switch 102 to prevent damage to circuitry and/or one or more devices.

In one example, the clamper 106 sets a limit for the voltage level at the fifth voltage node $V_{CLAMP}$, the limit to prevent the voltage level at the fifth voltage node $V_{CLAMP}$ from operating below the limit. For example, the voltage level at the fifth voltage node $V_{CLAMP}$ tracks the voltage level at the second voltage node $V_{OUT\_H}$ and when the voltage level at the second voltage node $V_{OUT\_H}$ is below a threshold value, the clamper 106 clamps the voltage level at the fifth voltage node $V_{CLAMP}$ to a voltage level defined by the clamper 106. In this example, the clamper 106 clamps the voltage level at the fifth voltage node $V_{CLAMP}$ by injecting a current (e.g., the fifth current $I_Y$) into the fifth voltage node $V_{CLAMP}$. When the voltage level at the second voltage node $V_{OUT\_H}$ is above a threshold value, the clamper 106 does not inject current (e.g., the fifth current $I_Y$) into the fifth voltage node $V_{CLAMP}$. However, when the voltage level at the second voltage node $V_{OUT\_H}$ is below a threshold value, the clamper 106 injects current (e.g., the fifth current $I_Y$) into the fifth voltage node $V_{CLAMP}$.

In other examples, the clamper 106 sets a limit for the voltage level at the fifth voltage node $V_{CLAMP}$, the limit to prevent the voltage level at the fifth voltage node $V_{CLAMP}$ from operating above the limit. In such other examples, the voltage level at the fifth voltage node $V_{CLAMP}$ tracks the voltage level at the second voltage node $V_{OUT\_H}$ and when the voltage level at the second voltage node $V_{OUT\_H}$ is above a threshold value, the clamper 106 clamps the voltage level at the fifth voltage node $V_{CLAMP}$ to a voltage level defined by the clamper 106. In these other examples, the clamper 106 clamps the voltage level at the fifth voltage node $V_{CLAMP}$ by drawing a current (e.g., the fifth current $I_Y$) from the fifth voltage node $V_{CLAMP}$. When the voltage level at the second voltage node $V_{OUT\_H}$ is below a threshold value, the clamper 106 does not draw current (e.g., the fifth current $I_Y$) from the fifth voltage node $V_{CLAMP}$. However, when the voltage level at the second voltage node $V_{OUT\_H}$ is above a threshold value, the clamper 106 draws current (e.g., the fifth current $I_Y$) from the fifth voltage node $V_{CLAMP}$.

In the illustrated example of FIG. 1, the current source 110 $I_B$ is a current source that is based on the current flowing from the fifth voltage node $V_{CLAMP}$ to the sixth voltage node GND. In other words, the current source 110 $I_B$ is based on the third current IA and the fifth current $I_Y$. In some examples the current source 110 $I_B$ is a portion of a current mirror. In other examples, the current source 110 $I_B$ is implemented as a constant current diode, a Zener diode current source, an operation amplifier current source, a voltage regulator current source, or any other type of suitable current source.

Figure 2:
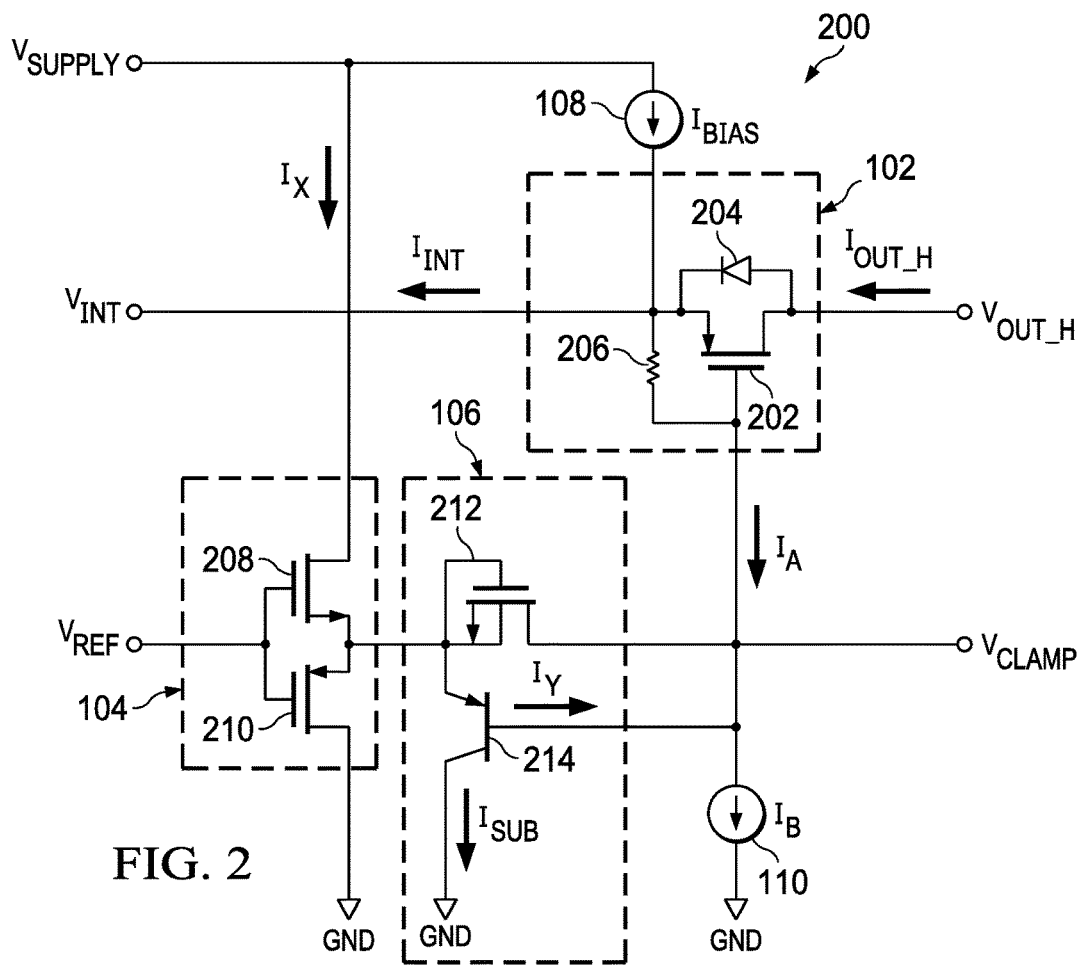
FIG. 2 is a schematic illustration of the example component level clamping circuit to implement the clamping circuit of FIG. 1.

FIG. 2 is a schematic illustration of the example component level clamping circuit 200 to implement the clamping circuit 100 of FIG. 1. The component level clamping circuit 200 includes the example voltage-controlled switch 102, the example voltage follower 104, the example clamper 106, the example biasing current source 108 ($I_{BIAS}$), the example current source 110 ($I_B$), the example first voltage node ($V_{SUPPLY}$), the example second voltage node ($V_{OUT\_H}$), the example third voltage node ($V_{INT}$), the example fourth voltage node ($V_{REF}$), the example fifth voltage node ($V_{CLAMP}$), and the example sixth voltage node (GND) of FIG. 1.

In the schematic illustration of FIG. 2, the example voltage-controlled switch 102 includes a first positive-channel MOSFET 202 (e.g., a positive-channel metal oxide semiconductor field effect transistor), a parasitic diode 204, and a resistor 206. In the schematic illustration, the example voltage follower 104 includes a first negative-channel MOSFET 208 (e.g., a negative-channel metal oxide semiconductor field effect transistor) and a second positive-channel MOSFET 210. In the schematic illustration, the example clamper 106 includes a second negative-channel MOSFET 212 and a parasitic PNP BJT 214.

In the illustrated example of FIG. 2, the example voltage-controlled switch 102 is coupled to the biasing current source 108 $I_{BIAS}$, the second voltage node $V_{OUT\_H}$, the third voltage node $V_{INT}$, and the fifth voltage node $V_{CLAMP}$. In the illustrated example, the example voltage follower 104 is coupled to the first voltage node $V_{SUPPLY}$, the fourth voltage node $V_{REF}$, the example clamper 106, and the sixth voltage node GND. The example clamper 106 is coupled to the fifth voltage node $V_{CLAMP}$ and the example voltage follower 104. The example biasing current source 108 $I_{BIAS}$ is coupled to the first voltage node $V_{SUPPLY}$ and the example voltage-controlled switch 102. The example current source 110 $I_B$ is coupled to the example fifth voltage node $V_{CLAMP}$ and the sixth voltage node GND.

In the schematic illustration of FIG. 2, the first voltage node $V_{SUPPLY}$ is a voltage node connected to a voltage source. The voltage source provides a source of power to the clamping circuit 100. In the illustrated example, the second voltage node $V_{OUT\_H}$ is a voltage node at which one or more devices are to be coupled to the clamping circuit 100. Example devices include ICs, IGBTs, MOSFETs, BJTs, JFETs, and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the schematic illustration of FIG. 2, the third voltage node $V_{INT}$ is a voltage node at which one or more devices are to be coupled to the clamping circuit 100. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements.

In the schematic illustration of FIG. 2, the example voltage-controlled switch 102 is implemented by the example first positive-channel MOSFET 202, the example parasitic diode 204, and the example resistor 206. In the schematic illustration, the first positive-channel MOSFET 202 includes an example first drain (e.g., a current terminal), an example first gate, and an example first source (e.g., a current terminal). The example parasitic diode 204 is coupled in parallel with the example first positive-channel MOSFET 202 from the example first drain to the example first source. The example resistor 206 is coupled between the example gate and the example first source. In the schematic illustration, the example first source is coupled to the third voltage node $V_{INT}$ and the example first drain is coupled to the fourth voltage node $V_{OUT\_H}$. The example first source is also coupled to the example biasing current source 108. The example gate is coupled the fifth voltage node $V_{CLAMP}$.

In the schematic illustration of FIG. 2, the voltage level at the first source of the first positive-channel MOSFET 202 is set by the example biasing current source 108 $I_{BIAS}$. For example, the biasing current source 108 $I_{BIAS}$ injects a current into the example first source of the first positive-channel MOSFET 202. The current injected by the example biasing current source 108 $I_{BIAS}$ ensures that the majority of the first current $I_{OUT\_H}$ flows from the example first drain to the example first source of the first positive-channel MOSFET 202 as opposed to through the parasitic diode 204. The voltage drop across the example resistor 206 sets the voltage level at the fifth voltage node $V_{CLAMP}$. The voltage drop across the example resistor 206 sets the gate-to-source voltage for the example first positive-channel MOSFET 202 to enable the example first positive-channel MOSFET 202. Thus, in the illustrated example, the first positive-channel MOSFET 202 conducts current (e.g., approximately $I_{OUT\_H}$) flowing from the second voltage node $V_{OUT\_H}$ to the fifth voltage node $V_{CLAMP}$ through the resistor 206 when the voltage level at the second voltage node $V_{OUT\_H}$ is above a threshold value. Additionally, the parasitic diode 204 conducts current flowing from the second voltage node $V_{OUT\_H}$ to the fifth voltage node $V_{CLAMP}$ through the resistor 206 when the voltage level at the second voltage node $V_{OUT\_H}$ is above a threshold value. Furthermore, when the voltage level at the second voltage node $V_{OUT\_H}$ is below a threshold value, neither the first positive-channel MOSFET 202 nor the parasitic diode 204 conduct current.

In the schematic illustration of FIG. 2, the example voltage follower 104 is implemented by the example first negative-channel MOSFET 208 and the example second positive-channel MOSFET 210. The example first negative-channel MOSFET 208 includes a second source (e.g., a current terminal), a second gate, and a second drain (e.g., a current terminal) and the example second positive-channel MOSFET 210 includes a third source (e.g., a current terminal), a third gate, and a third drain (e.g., a current terminal). In the schematic illustration, the second drain of the first negative-channel MOSFET 208 is coupled to the first voltage node $V_{SUPPLY}$. The current flowing from the first voltage node $V_{SUPPLY}$ to the second drain of the example first negative-channel MOSFET 208 is the fourth current $I_X$. The second gate of the example first negative-channel MOSFET 208 and the third gate of the example second positive-channel MOSFET 210 are coupled to the fourth voltage node $V_{REF}$. The second source of the example first negative-channel MOSFET 208 and the third source of the example second positive-channel MOSFET 210 are coupled to the example second negative-channel MOSFET 212. The third drain of the example second positive-channel MOSFET 210 is coupled to the sixth voltage node GND.

In the schematic illustration of FIG. 2, the voltage level at the fourth voltage node $V_{REF}$ sets the gate-to-source voltage level for the example first negative-channel MOSFET 208. In the example schematic illustration, the example second positive-channel MOSFET 210 is not enabled because the gate-to-source voltage level is not met by the voltage level at fourth voltage node $V_{REF}$. Additionally, the voltage level at the fourth voltage node $V_{REF}$ sets the voltage level at the second source of the first negative-channel MOSFET 208 to be the voltage level at the fourth voltage node $V_{REF}$ minus the gate-to-source voltage drop of the first negative-channel MOSFET 208 ($V_{REF}-V_{GS}$).

In the schematic illustration of FIG. 2, the clamper 106 is implemented by a second negative-channel MOSFET 212 and a parasitic PNP BJT 214. In the example, the second negative-channel MOSFET 212 is a high voltage LDMOS-FET. In other examples, the second negative-channel MOSFET 212 is a high voltage DEMOSFET, or any other suitable transistor to clamp the voltage level at the fifth voltage node $V_{CLAMP}$. The example second negative-channel MOSFET 212 includes a fourth source (e.g., a current terminal), a fourth gate, a fourth drain (e.g., a current terminal), a back-gate terminal (e.g., a current terminal), and a back-gate terminal (e.g., a current terminal). The fourth source of the second negative-channel MOSFET 212 is coupled to the fourth gate of the second negative-channel MOSFET 212, the back-gate terminal of the second negative-channel MOSFET 212, the second source of the first negative-channel MOSFET 208, and the third source of the second positive-channel MOSFET 210. The drain of the second negative-channel MOSFET 212 is coupled to the fifth voltage node $V_{CLAMP}$. The parasitic PNP BJT 214 includes an emitter (e.g., a current terminal), a base (e.g., a current terminal), and a collector (e.g., a current terminal). The emitter of the parasitic PNP BJT 214 is coupled to the fourth gate of the example second negative-channel MOSFET 212. The base of the parasitic PNP BJT 214 is coupled to the fifth voltage node $V_{CLAMP}$. The collector of the parasitic PNP BJT 214 is coupled to the sixth voltage node GND. The parasitic PNP BJT 214 results from a parasitic back-gate-to-drain diode included in the second negative-channel MOSFET 212 and a parasitic drain-to-substrate diode included in the second negative-channel MOSFET 212. The current flowing out of the collector of the parasitic PNP BJT 214 is a sixth current $I_{SUB}$. The current flowing out of the base of the parasitic PNP BJT 214 is the fifth current $I_Y$. Because the fourth gate and the fourth source of the example second negative-channel MOSFET 212 are coupled to one another, the example second negative-channel MOSFET 212 does not conduct current. The sixth current $I_{SUB}$ is equal to the gain coefficient ($\beta$) of the parasitic PNP BJT 214 multiplied by the fifth current $I_Y$ ($I_{SUB}=\beta*I_Y$).

In the example of FIG. 2, the example clamper 106 is a circuit that clamps a voltage node to a desired voltage level. More specifically, the parasitic back-gate-to-drain diode of the second negative-channel MOSFET 212 clamps the voltage level at the fifth voltage node $V_{CLAMP}$. The parasitic back-gate-to-drain diode of the second negative-channel MOSFET 212 clamps the voltage level at the fifth voltage node $V_{CLAMP}$ when the voltage level at the second voltage node $V_{OUT\_H}$ is below a threshold value. More specifically, the parasitic PNP BJT 214 injects current (e.g., the fifth current $I_Y$) into the fifth voltage node $V_{CLAMP}$ to supply the current source 110 $I_B$. The parasitic PNP BJT 214 clamps the voltage level at the fifth voltage node $V_{CLAMP}$ to protect the first positive-channel MOSFET 202 and therefore to ensure proper functionality of the one or more devices and/or circuitry coupled to the first positive-channel MOSFET 202.

For example, when the first positive-channel MOSFET 202 is coupled to a gate of an IGBT at the second voltage node $V_{OUT\_H}$, the voltage level at the second voltage node $V_{OUT\_H}$ varies to control the IGBT. In such an example, if the IGBT is controlled to be conducting the second voltage node $V_{OUT\_H}$ is high. In such an example, the voltage level at the fifth voltage node $V_{CLAMP}$ is equal to the voltage level at the second voltage node $V_{OUT\_H}$ minus the voltage drop across the first positive-channel MOSFET 202 and the voltage drop across the resistor 206 (e.g., $V_{CLAMP}=V_{OUT\_H}-V_{204}-V_{206}$). If the voltage level at the second voltage node $V_{OUT\_H}$ goes below a threshold value, the first positive-channel MOSFET 202 is disabled. In such an example, the threshold value that disables the first positive-channel MOSFET 202 and enables the clamper 106 is the voltage level at the fourth voltage node $V_{REF}$ minus the voltage drop from the gate to source of the first negative-channel MOSFET 208 and the voltage drop across the second negative-channel MOSFET 212 (e.g., $V_{CLAMP}=V_{REF}-V_{GS,\ 208}-V_{212}$). If the first positive-channel MOSFET 202 is disabled (e.g., abruptly disabled), one or more devices coupled to the third voltage node $V_{INT}$ may experience transient voltage and current events that may damage and/or destroy the first positive-channel MOSFET 202 and/or the one or more devices coupled to the third voltage node $V_{INT}$. Therefore, it is advantageous to clamp the voltage level at that controls the first positive-channel MOSFET 202 to prevent damage to circuitry and/or one or more devices.

In one example, the parasitic PNP BJT 214 sets a limit for the voltage level at the fifth voltage node $V_{CLAMP}$, the limit to prevent the voltage level at the fifth voltage node $V_{CLAMP}$ from operating below the limit. For example, the voltage level at the fifth voltage node $V_{CLAMP}$ tracks the voltage level at the second voltage node $V_{OUT\_H}$ and when the voltage level at the second voltage node $V_{OUT\_H}$ is below a threshold value, the parasitic PNP BJT 214 clamps the voltage level at the fifth voltage node $V_{CLAMP}$ to a voltage level defined by the voltage drop across the back-gate-to-drain diode of the parasitic PNP BJT 214. For example, the voltage level at the gate of the second negative-channel MOSFET 212 is equal to the voltage level at the fourth voltage node $V_{REF}$ (e.g., 12 volts (V)) minus the gate-to-source voltage drop of the first negative-channel MOSFET 208 (e.g., 3 V). In this example, the parasitic PNP BJT 214 clamps the voltage level at the fifth voltage node $V_{CLAMP}$ to the voltage level at the gate of the second negative-channel MOSFET 212 (e.g., 9 V) minus the voltage drop across the parasitic back-gate-to-drain diode of the parasitic PNP BJT 214 included in the second negative-channel MOSFET 212 (e.g., 0.7 V).

In such an example, the parasitic PNP BJT 214 clamps the voltage at the fifth voltage node $V_{CLAMP}$ by injecting a current (e.g., the fifth current $I_Y$) into the fifth voltage node $V_{CLAMP}$. When the voltage level at the second voltage node $V_{OUT\_H}$ is above a threshold value, the parasitic PNP BJT 214 does not inject current (e.g., the fifth current $I_Y$) into the fifth voltage node $V_{CLAMP}$. However, when the voltage level at the second voltage node $V_{OUT\_H}$ is below a threshold value, the parasitic PNP BJT 214 injects current (e.g., the fifth current $I_Y$) into the fifth voltage node $V_{CLAMP}$.

In the example of FIG. 2, when the clamper 106 is clamping, the current source 110 $I_B$ is majorly dependent on the fifth current $I_Y$. As the current sourced by the current source 110 $I_B$ increases, the current (e.g., the fifth current $I_Y$) flowing from the base of the parasitic PNP BJT 214 will increase with a direct relationship. Thus, the current (e.g., the sixth current $I_{SUB}$) flowing out of the collector of the parasitic PNP BJT 214 increases directly, by a proportion (e.g., the gain factor, β). The current (e.g., the sixth current $I_{SUB}$) flowing out of the collector of the parasitic PNP BJT 214 causes serious losses in the component level clamping circuit 200 and damages and/or destroys the second negative-channel MOSFET 212.

Figure 3:
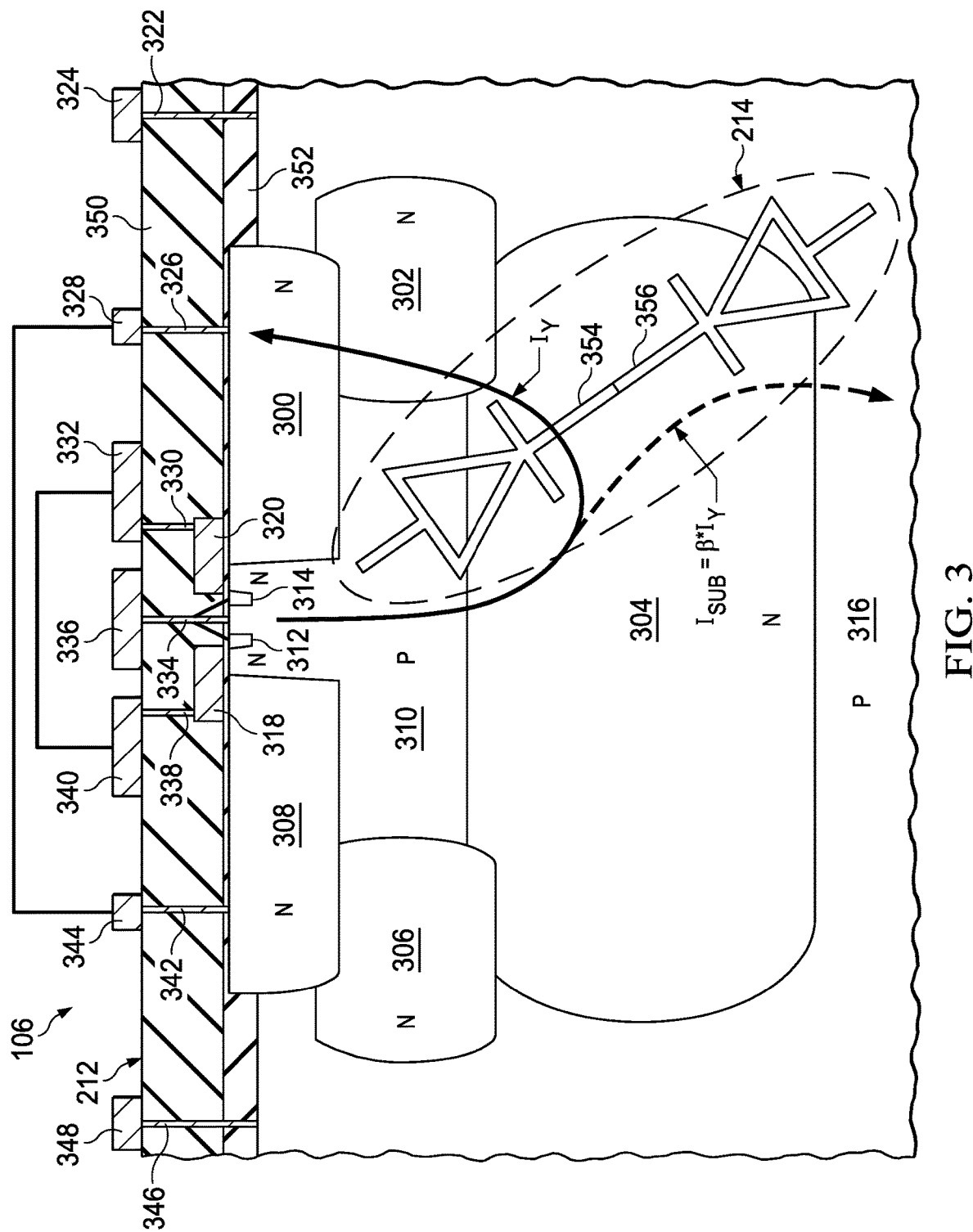
FIG. 3 is an illustration showing further detail of the example clamper of FIG. 2.

FIG. 3 is an illustration showing further detail of the example clamper 106 of FIG. 2. The example clamper 106 of FIG. 2 includes the example second negative-channel MOSFET 212 of FIG. 2 and the example parasitic PNP BJT 214 of FIG. 2. The example second negative-channel MOSFET 212 includes the parasitic PNP BJT 214, a first negatively doped (N-type) region 300, a second N-type region 302, a third N-type region 304, a fourth N-type region 306, a fifth N-type region 308, a first positively doped (P-type) region 310, a sixth N-type region 312, a seventh N-type region 314, a second P-type region 316, a first metal region 318, a second metal region 320, a first contact 322, a third metal region 324, a second contact 326, a fourth metal region 328, a third contact 330, a fifth metal region 332, a fourth contact 334, a sixth metal region 336, a fifth contact 338, a seventh metal region 340, a sixth contact 342, an eighth metal region 344, a seventh contact 346, a ninth metal region 348, an oxide layer 350, and an isolation layer 352. The example parasitic PNP BJT 214 includes an example first PN junction 354 (e.g., an example parasitic back-gate-to-drain diode) and an example second PN junction 356 (e.g., an example parasitic drain-to-substrate diode).

In the illustrated example of FIG. 3, the third metal region 324, the fourth metal region 328, the fifth metal region 332, the sixth metal region 336, the seventh metal region 340, the eighth metal region 344, and the ninth metal region 348 are above the oxide layer 350. The example first metal region 318, the example second metal region 320, and the example oxide layer 350 are above the isolation layer 352. The isolation layer 352 is above the first N-type region 300, the fifth N-type region 308, the first P-type region 310, the sixth N-typed region 312, the seventh N-type region 314, and the second P-type region 316. The example first N-type region 300 and the example fifth N-type region 308 are above the second N-type region 302 and the fourth N-type region 306.

In the illustrated example, the first N-type region 300, the second N-type region 302, the third N-type region 304, the fourth N-type region 306, the fifth N-type region 308, the sixth N-type region 312, and the seventh N-type region 314 are regions of silicon (Si) negatively doped with phosphorous ions ($P^-$). In other examples, the N-type region doping agent is antimony ions ($Sb^-$), gallium ions ($As^-$), or any other suitable N-type doping agent. In the example, the first P-type region 310 and the second P-type region 316 are regions of Si positively doped with boron ions ($B^+$). In other examples, the P-type region doping agent is aluminum ions ($Al^+$), gallium ions ($Ga^+$), or any other suitable P-type doping agent.

In further examples, the first N-type region 300, the second N-type region 302, the third N-type region 304, the fourth N-type region 306, the fifth N-type region 308, the sixth N-type region 312, and the seventh N-type region 314 are regions of gallium-arsenide (GaAs) negatively doped with sulfur ions ($S^-$). In other such examples, the N-type region doping agent is selenium ions ($Se^-$), tellurium ions ($Te^-$), $Si^-$ ions, germanium ions ($Ge^-$), or any other suitable N-type doping agent. In further examples, the first P-type region 310 and the second P-type region 316 are regions of GaAs positively doped with magnesium ions (Mg+). In other such examples, the P-type region doping agent is zinc ions (Zn+), cadmium ions (Cd+), Si+ ions, Ge+ ions or any other suitable P-type doping agent.

In the illustrated example, the example first metal region 318, the example second metal region 320, the first contact 322, the third metal region 324, the second contact 326, the fourth metal region 328, the third contact 330, the fifth metal region 332, the fourth contact 334, the sixth metal region 336, the fifth contact 338, the seventh metal region 340, the sixth contact 342, the eighth metal region 344, the seventh contact 346, and the ninth metal region 348 are aluminum. In further examples, the example first metal region 318, the example second metal region 320, the first contact 322, the third metal region 324, the second contact 326, the fourth metal region 328, the third contact 330, the fifth metal region 332, the fourth contact 334, the sixth metal region 336, the fifth contact 338, the seventh metal region 340, the sixth contact 342, the eighth metal region 344, the seventh contact 346, and the ninth metal region 348 are any other suitable metal. In the illustrated example, the oxide layer 350 and the isolation layer 352 are silicon oxide (SiO$_2$) layers. In further examples, the oxide layer 350 and the isolation layer 352 are any other suitable isolation layers.

In the illustrated example, the first N-type region 300, the second N-type region 302, the third N-type region 304, the fourth N-type region 306, and the fifth N-type region 308 make up the drain of the example second negative-channel MOSFET 212. In the illustrated example, the sixth N-type region 312 and the seventh N-type region 314 make up the source of the example second negative-channel MOSFET 212. In the illustrated example, the second P-type region 316 is the substrate of the example second negative-channel MOSFET 212. In the illustrated example, the first P-type region 310 is the back-gate of the example second negative-channel MOSFET 212. In the illustrated example, the first metal region 318 and the second metal region 320 make up the gate of the example second negative-channel MOSFET 212.

In the illustrated example, the second P-type region 316 is coupled to the third metal region 324 via the first contact 322 and the ninth metal region 348 via the seventh contact 346. The second P-type region 316, the first contact 322, the third metal region 324, the seventh contact 346, and the ninth metal region 348 are at the same potential. In the illustrated example, the fourth metal region 328 is coupled to the first N-type region 300 via the second contact 326. In the illustrated example, the eighth metal region 344 is coupled to the fifth N-type region 308 via the sixth contact 342. In the illustrated examples, the fourth metal region 328, the second contact 326, the first N-type region 300, the second N-type region 302, the third N-type region 304, the fourth N-type region 306, the fifth N-type region 308, the sixth contact 342, and the eighth metal region 344 are at the same potential. In the illustrated example, the first metal region 318 is coupled to the seventh metal region 340 via the fifth contact 338. In the illustrated example, the first metal region 318, the seventh metal region 340, and the fifth contact 338 are at the same potential. In the illustrated example, the second metal region 320 is coupled to the fifth metal region 332 via the third contact 330. In the illustrated example, the sixth metal region 336 is coupled to the first P-type region 310 via the fourth contact 334. The sixth metal region 336 is coupled to the sixth N-type region 312 and the seventh N-type region 314 via internal traces. In the illustrated example the fifth metal region 332 is coupled to the seventh metal region 340 and the eighth metal region 344 is coupled to the fourth metal region 328.

In the illustrated example, the first P-type region 310, the first N-type region 300, the second N-type region 302, the third N-type region 304, the fourth N-type region 306, and the fifth N-type region 308 form a first PN junction 354. In the illustrated example, the first N-type region 300, the second N-type region 302, the third N-type region 304, the fourth N-type region 306, fifth N-type region 308, and the second P-type region 316 form a second PN junction 356. The current flowing from the first P-type region 310 to the first N-type region 300, the second N-type region 302, the third N-type region 304, the fourth N-type region 306, and the fifth N-type region 308 is the fifth current $I_Y$. The current flowing from the first N-type region 300, the second N-type region 302, the third N-type region 304, the fourth N-type region 306, and fifth N-type region 308 to the second P-type region 316 is the sixth current $I_{SUB}$. Together, the first PN junction 354 and the second PN junction 356 form the parasitic PNP BJT 214. The first P-type region 310 makes up the emitter of the parasitic PNP BJT 214. The coupling between the first PN junction 354 and the second PN junction 356 (e.g., the third N-type region 304) makes up the base of the parasitic PNP BJT 214. The second P-type region 316 makes up the collector of the parasitic PNP BJT 214. The sixth current $I_{SUB}$ is proportional to the fifth current $I_Y$ by the gain factor ($\beta$) of the parasitic PNP BJT 214.

Figure 4:
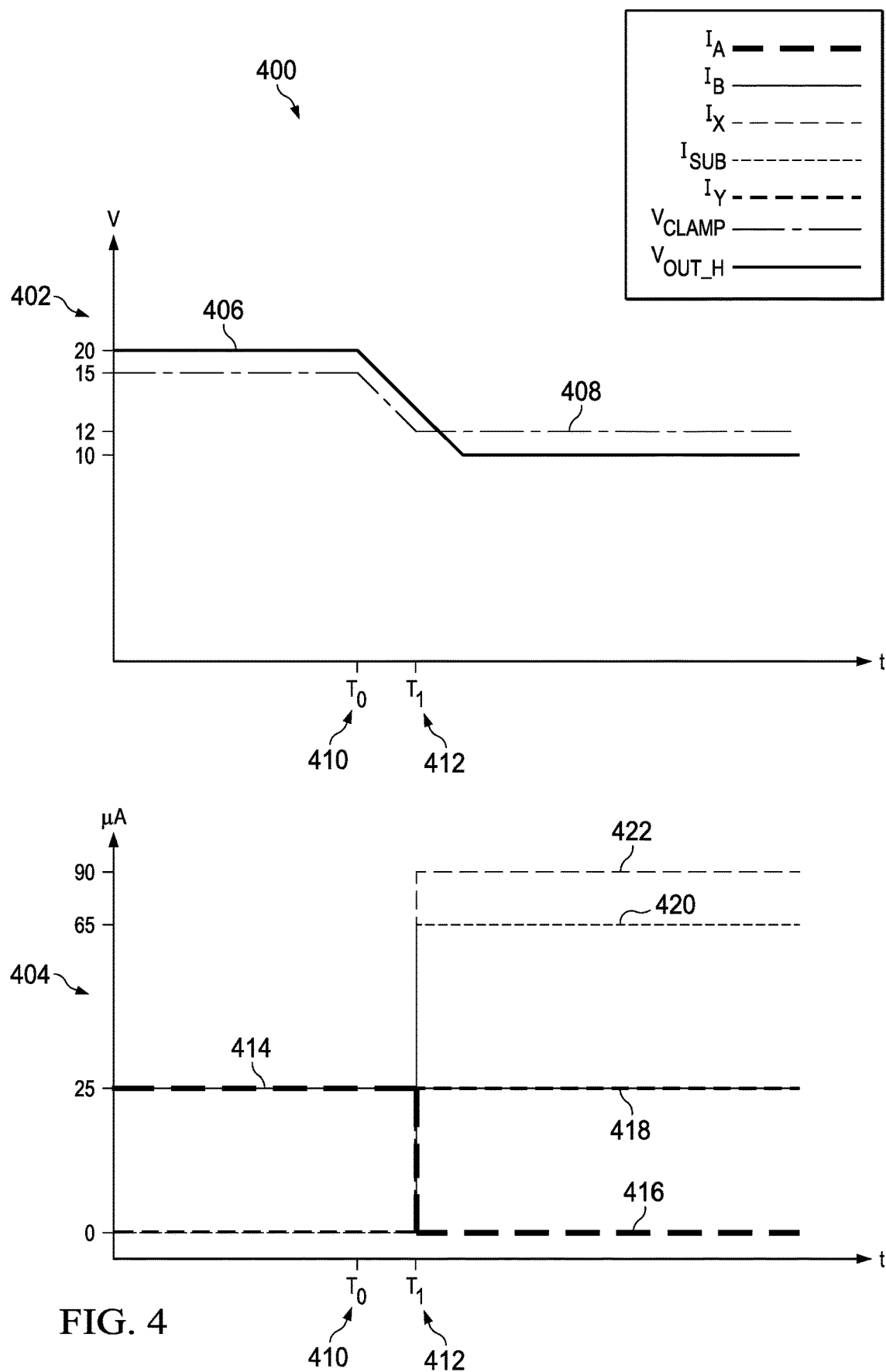
FIG. 4 is a graphical illustration of various voltage levels and current level versus time associated with the example clamping circuit of FIG. 2.

FIG. 4 is a graphical illustration of various voltage levels and current level versus time associated with the example component level clamping circuit 200 of FIG. 2. FIG. 4 includes a voltage plot 402 and a current plot 404. The voltage plot 402 illustrates various voltages levels versus time in the component level clamping circuit 200 versus time. The voltage plot 402 includes a first curve 406, a second curve 408, a first time 410 ($T_0$), and a second time 412 ($T_1$). The first curve 406 represents the voltage level at the second voltage node $V_{OUT\_H}$ of the component level clamping circuit 200. The second curve 408 represents the voltage level at the fifth voltage plot $V_{CLAMP}$ of the component level clamping circuit 200. The first time 410 $T_0$ represents a time at which the voltage level at the second voltage node $V_{OUT\_H}$ begins to decrease from its current voltage level. The second time 412 $T_1$ represents a time at which the voltage level at the fifth voltage node $V_{CLAMP}$ reaches a threshold value.

The current plot 404 illustrates various current levels versus time in the component level clamping circuit 200 versus time. The current plot 404 includes a third curve 414, a fourth curve 416, a fifth curve 418, a sixth curve 420, a seventh curve 422, the first time 410 $T_0$, and the second time 412 $T_1$. The third curve 414 represents the current source 110 $I_B$. The fourth curve 416 represents the third current IA. The fifth curve 418 represents the fifth current $I_Y$. The sixth curve 420 represents the sixth current $I_{SUB}$. The seventh curve 422 represents the fourth current $I_X$.

In the illustrated example of FIG. 4, before the first time 410 $T_0$, the example first curve 406 is at a voltage level of 20 V, the example second curve 408 is at a voltage level of 15 V, the example third curve 414 is at a current level of 25 µA, the example fourth curve 416 is at a current level of 25 µA, the example fifth curve 418 is at a current level of 0 µA, the example sixth curve 420 is at a current level of 0 µA, and the example seventh curve 422 is at a current level of 0 µA. At the first time 410 $T_0$, the example first curve 406 begins to transition from a voltage level of 20 V to a voltage level of 10 V and the example second curve 408 begins to transition from a voltage level of 15 V to a voltage level of 12 V.

At the second time 412 $T_1$, the example clamper 106 clamps the voltage level at the fifth voltage node $V_{CLAMP}$ to a threshold value. At the second time 412 $T_1$, the example first curve 406 continues to transition from 20 V to 10 V. At the second time 412 $T_1$, the voltage level of the example first curve 406 is 12 V. At the second time 412 $T_1$, the example second curve 408 is at a voltage level of 12 V, the example third curve 414 is at a current level of 25 μA, the example fourth curve 416 begins to transition from a current of 25 μA to a current level of 0 μA, the example fifth current curve 418 begins to transition from a current level of 0 μA to a current level of 25 μA, the example sixth curve 420 begins to transition from a current level of 0 μA to a current level of 65 μA, and the example seventh curve 422 begins to transition from a current level of 0 μA to a current level of 90 μA.

After the second time 412 $T_1$, the clamper 106 continues to clamp the voltage level at the fifth voltage node $V_{CLAMP}$ to the threshold value. After the second time 412 $T_1$, the example first curve 406 continues to transition from a voltage level of 20 V to a voltage level of 10 V and maintains a voltage level of 10 V, the example second curve 408 maintains a voltage level of 10 V, the example third curve 414 maintains a current level of 25 μA, the example fourth curve 416 maintains a current level of 0 μA, the example fifth curve 418 maintains a current level of 25 μA, the example sixth curve 420 maintains a current level of 65 μA, and the example seventh curve 422 maintains a current level of 90 μA.

In such an example as illustrated in FIG. 4, the current level of the sixth current $I_{SUB}$ is sufficiently high (e.g., 65 μA) to cause the second negative-channel MOSFET 212 to experience a latch-up event. Such a latch-up event can damage and/or destroy the second negative-channel MOSFET 212 and/or one or more devices or circuitry coupled to the second voltage node $V_{OUT\_H}$ and the third voltage node $V_{INT}$.

Figure 5:
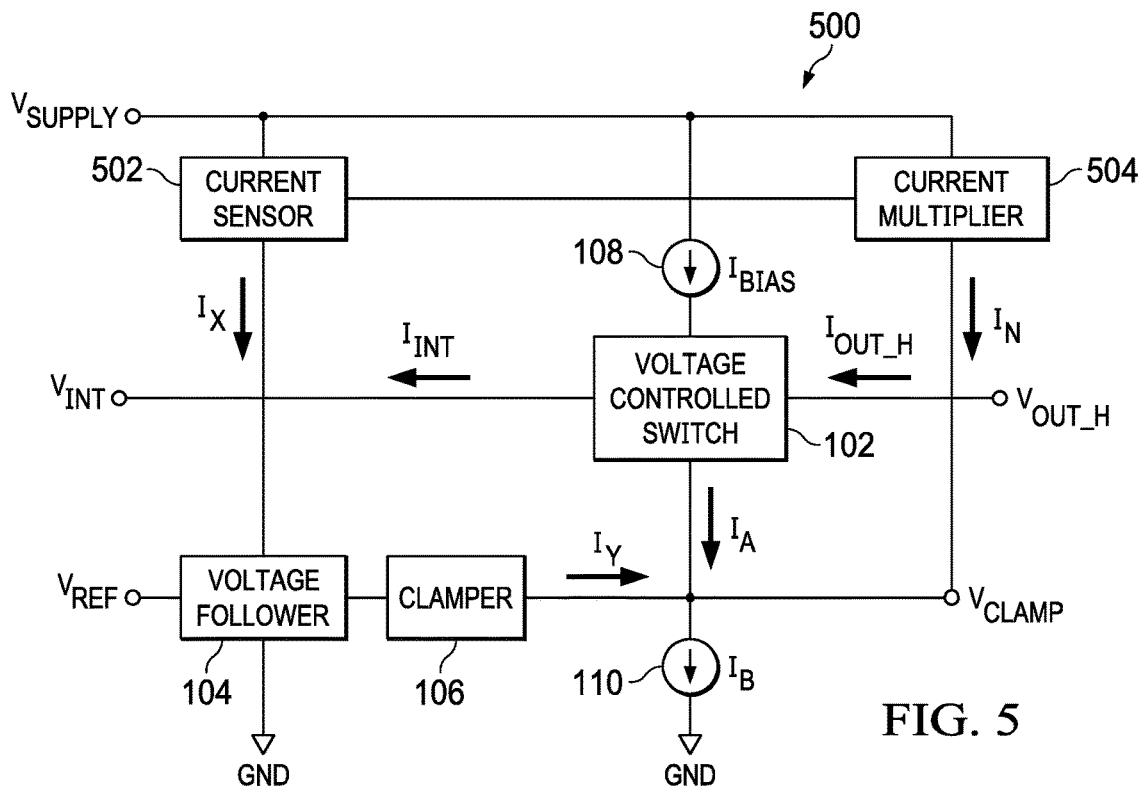
FIG. 5 is a block diagram of an example clamping circuit including a current sensor and a current multiplier.

FIG. 5 is a block diagram of an example clamping circuit 500 including a current sensor 502 and a current multiplier 504. The clamping circuit 500 includes the example voltage-controlled switch 102, the example voltage follower 104, the example clamper 106, the example biasing current source 108 ($I_{BIAS}$), the example current source 110 ($I_B$), the example first voltage node ($V_{SUPPLY}$), the example second voltage node ($V_{OUT\_H}$), the example third voltage node ($V_{INT}$), the example fourth voltage node ($V_{REF}$), the example fifth voltage node ($V_{CLAMP}$), and the example sixth voltage node (GND) of FIG. 1.

In the illustrated example of FIG. 5, the example current sensor 502 is coupled to the first voltage node $V_{SUPPLY}$, the example current multiplier 504, and the example voltage follower 104. In the illustrated example, the example current multiplier 504 is coupled to the first voltage node $V_{SUPPLY}$, the example current sensor 502, and the fifth voltage node $V_{CLAMP}$. In the example, the example voltage-controlled switch 102 is coupled to the biasing current source 108 $I_{BIAS}$, the second voltage node $V_{OUT\_H}$, the third voltage node $V_{INT}$, and the fifth voltage node $V_{CLAMP}$. In the illustrated example, the example voltage follower 104 is coupled to the example current sensor 502, the fourth voltage node $V_{REF}$, the example clamper 106, and the sixth voltage node GND. The example clamper 106 is coupled to the fifth voltage node $V_{CLAMP}$ and the example voltage follower 104. The example biasing current source 108 $I_{BIAS}$ is coupled to the first voltage node $V_{SUPPLY}$ and the example voltage-controlled switch 102. The example current source 110 $I_B$ is coupled to the example fifth voltage node $V_{CLAMP}$ and the sixth voltage node GND.

In the illustrated example of FIG. 5, the first voltage node $V_{SUPPLY}$ is a voltage node connected to a voltage source. The voltage source provides a source of power to the clamping circuit 500. In the illustrated example, the second voltage node $V_{OUT\_H}$ is a voltage node at which one or more devices are to be coupled to the clamping circuit 500. Example devices include ICs, IGBTs, MOSFETs, BJTs, JFETs, and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the illustrated example of FIG. 5, the third voltage node $V_{INT}$ is a voltage node at which one or more devices are to be coupled to the clamping circuit 500. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements.

In the illustrated example of FIG. 5, the voltage-controlled switch 102 is an electrical switch that controls conduction between the second voltage node $V_{OUT\_H}$ and the fifth voltage node $V_{CLAMP}$. In some examples, the voltage-controlled switch 102 is a parasitic body diode of a transistor. In other examples, the voltage-controlled switch 102 is a transistor, in further examples, the voltage-controlled switch 102 is a combination of a transistor and the parasitic body diode of the transistor. In the illustrated example, the voltage-controlled switch 102 is controlled by a voltage drop between a first voltage level at the biasing current source 108 $I_{BIAS}$ and a second voltage level at the fifth voltage node $V_{CLAMP}$. In the illustrated example, the current flowing between the example voltage-controlled switch 102 and the fifth voltage node $V_{CLAMP}$ is a third current IA.

In the illustrated example of FIG. 5, the fourth voltage node $V_{REF}$ is a voltage node at which a voltage level is applied. The voltage level is a reference voltage level for a desired voltage level at the fifth voltage node $V_{CLAMP}$. In the illustrated example of FIG. 5, the example voltage follower 104 is a circuit that isolates the fourth voltage node $V_{REF}$ from the other elements of the clamping circuit 500. The current flowing between the example current sensor 502 and the example voltage follower 104 is a fourth current $I_X$.

In the illustrated example of FIG. 5, the example clamper 106 is a circuit that clamps a voltage node to a desired voltage level. In some examples, the clamper 106 is a combination of a MOSFET and a parasitic component such as a diode. In other examples, the clamper is a diode, such as a Schottky diode. The current flowing from the clamper 106 to the fifth voltage node $V_{CLAMP}$ is a fifth current $I_Y$. The clamper 106 clamps the voltage level at a voltage node when the voltage is below a threshold value. The clamper 106 clamps the voltage level at the fifth voltage node $V_{CLAMP}$ to protect the voltage-controlled switch 102 and therefore to ensure proper functionality of the one or more devices coupled to the voltage-controlled switch 102.

For example, when the voltage-controlled switch 102 is coupled to a gate of an IGBT at the second voltage node $V_{OUT\_H}$, the voltage level at the second voltage node $V_{OUT\_H}$ varies to control the IGBT. In such an example, if the voltage level at the second voltage node $V_{OUT\_H}$ goes below a threshold value, the voltage-controlled switch 102 is disabled. If the voltage-controlled switch 102 is disabled (e.g., abruptly disabled), one or more devices coupled to the third voltage node $V_{INT}$ may experience transient voltage and current events that may damage and/or destroy the voltage-controlled switch 102 and/or the one or more devices coupled to the third voltage node $V_{INT}$. Therefore, it is advantageous to clamp the voltage level that controls the voltage-controlled switch 102 to prevent damage to circuitry and/or one or more devices.

In the example, the clamper 106 sets a limit for the voltage level at the fifth voltage node $V_{CLAMP}$, the limit to prevent the voltage level at the fifth voltage node $V_{CLAMP}$ from operating below the limit. For example, the voltage level at the fifth voltage node $V_{CLAMP}$ tracks the voltage level at the second voltage node $V_{OUT\_H}$ and when the voltage level at the second voltage node $V_{OUT\_H}$ is below a threshold value, the clamper 106 clamps the voltage level at the fifth voltage node $V_{CLAMP}$ to a voltage level defined by the clamper 106. In this example, the clamper 106 clamps the voltage level at the fifth voltage node $V_{CLAMP}$ by injecting a current (e.g., the fifth current $I_Y$) into the fifth voltage node $V_{CLAMP}$. When the voltage level at the second voltage node $V_{OUT\_H}$ is above a threshold value, the clamper 106 does not inject current (e.g., the fifth current $I_Y$) into the fifth voltage node $V_{CLAMP}$. However, when the voltage level at the second voltage node $V_{OUT\_H}$ is below a threshold value, the clamper 106 injects current (e.g., the fifth current $I_Y$) into the fifth voltage node $V_{CLAMP}$. In some examples, the clamper 106 includes parasitic components that cause leakage current (e.g., a sixth current $I_{LEAK}$) in the clamper 106. For example, the sixth current $I_{LEAK}$ is undesired current flowing from the clamper 106 to the sixth voltage node GND.

In the illustrated example of FIG. 5, the current sensor 502 is a device that senses the fourth current $I_X$ flowing between the current sensor 502 and the example voltage follower 104. In some examples, the current sensor 502 is a portion of a current mirror (e.g., a MOSFET). In other examples, the current sensor 502 is a current shunt, a Hall effect sensor, a fiber optic current sensor, a Rogowski coil, or any other type of suitable current sensor.

In the illustrated example of FIG. 5, the current multiplier 504 is a device that outputs a current (e.g., a seventh current $I_N$) proportional by a ratio (1:N) to the sensed current (e.g., $I_N=N*I_X$). In some examples, the current multiplier 504 is a current controlled current source (e.g., a portion of a current mirror, a MOSFET, etc.). In other examples, the current multiplier 504 is a class B amplifier, a class AB amplifier, or any other type of current multiplier that is suitable for the application. In the illustrated example, the current multiplier 504 is to output a current (e.g., the seventh current $I_N$), the current (e.g., the seventh current $I_N$) to reduce a leakage current through a parasitic component in the clamper 106. In other words, the current multiplier 504 outputs a current (e.g., the seventh current $I_N$) to reduce the current flowing from the clamper 106 to the sixth voltage node GND.

In the illustrated example of FIG. 5, when the voltage level at the second voltage node $V_{OUT\_H}$ is below a threshold value, the clamper 106 is active. In examples where the clamper 106 is active, the fourth current $I_X$ is equal to the fifth current $I_Y$ plus the sixth current $I_{LEAK}$ ($I_X=I_Y+I_{LEAK}$) caused by parasitic components in the example clamper 106.

In the illustrated example of FIG. 5, the current source 110 $I_B$ is a current source that is based on the current flowing from the fifth voltage node $V_{CLAMP}$ to the sixth voltage node GND. In other words, the current source 110 $I_B$ is based on the third current IA and the fifth current $I_Y$. In some examples the current source 110 $I_B$ is a portion of a current mirror. In other examples, the current source 110 $I_B$ is implemented as a constant current diode, a Zener diode current source, an operation amplifier current source, a voltage regulator current source, or any other type of suitable current source.

In the example of FIG. 5, when the clamper 106 is clamping, the current source 110 $I_B$ is dependent on the fifth current $I_Y$ and the seventh current $I_N$. As the current sourced by the current source 110 $I_B$ increases, the seventh current $I_N$ supplies the majority of the current to the current source 110 $I_B$. Thus, the current (e.g., the sixth current $I_{LEAK}$) caused by parasitic components does not contribute to the majority of the current sourced by the current source 110 $I_B$ due to the proportional ratio between the fourth current $I_X$ and the seventh current $I_N$. Therefore, the sixth current $I_{LEAK}$ is thereby reduced by the seventh current $I_N$.

Figure 6:
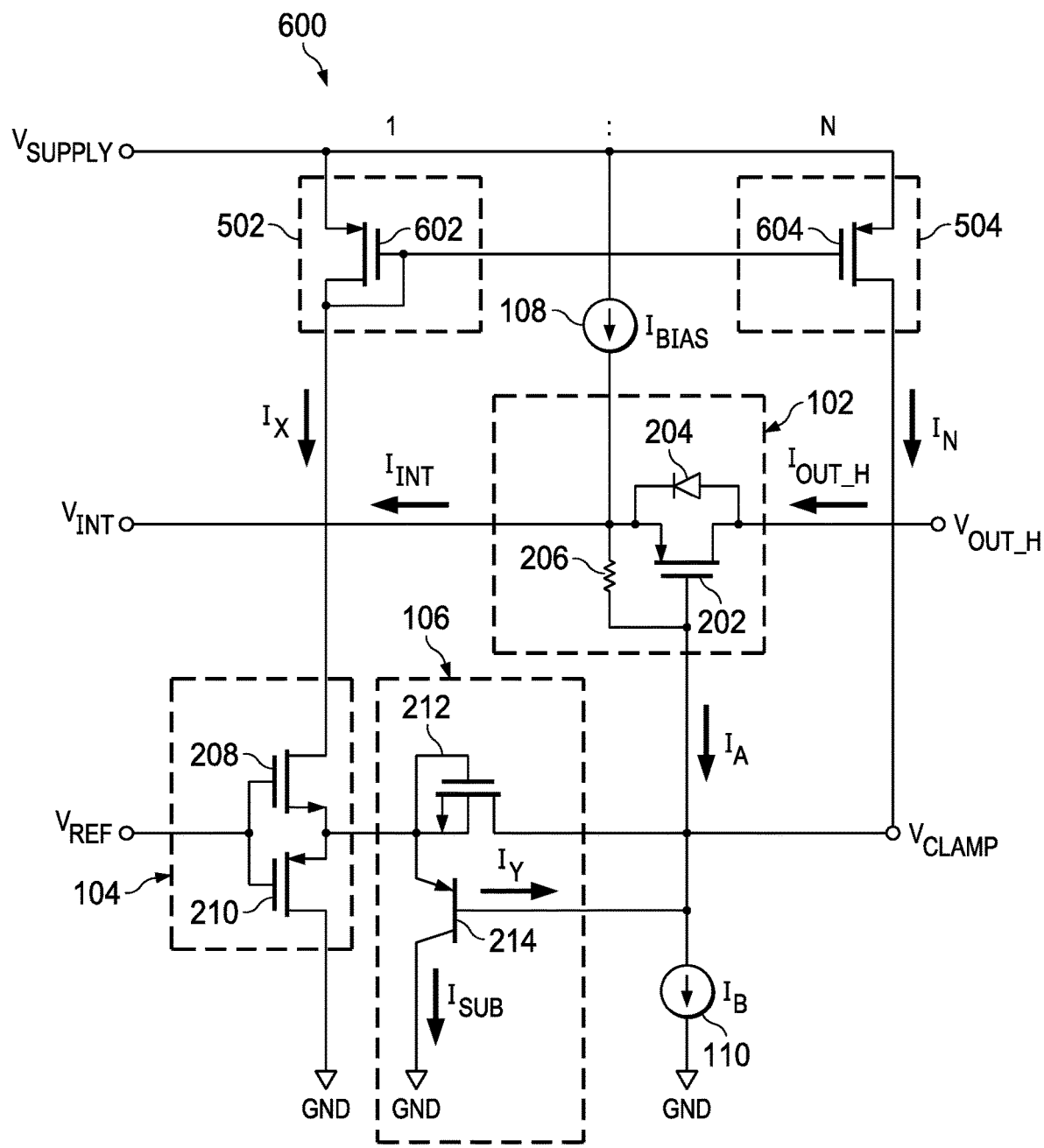
FIG. 6 is a schematic illustration of the example component level clamping circuit to implement the clamping circuit of FIG. 5.

FIG. 6 is a schematic illustration of the example component level clamping circuit 600 to implement the clamping circuit 500 of FIG. 5. The component level clamping circuit 600 includes an example current sensor 502, an example current multiplier 504, the example voltage-controlled switch 102, the example voltage follower 104, the example clamper 106, the example biasing current source 108 ($I_{BIAS}$), the example current source 110 ($I_B$), the example first voltage node ($V_{SUPPLY}$), the example second voltage node ($V_{OUT\_H}$), the example third voltage node ($V_{INT}$), the example fourth voltage node ($V_{REF}$), the example fifth voltage node ($V_{CLAMP}$), and the example sixth voltage node (GND) of FIG. 1.

In the schematic illustration of FIG. 6, the example voltage-controlled switch 102 includes the first positive-channel MOSFET 202, the parasitic diode 204, and the resistor 206 of FIG. 2. In the schematic illustration, the example voltage follower 104 includes the first negative-channel MOSFET 208 and the second positive-channel MOSFET 210 of FIG. 2. In the schematic illustration, the example clamper 106 includes a second negative-channel MOSFET 212 and a parasitic PNP BJT 214 of FIG. 2. In the schematic illustration, the example current sensor 502 includes a third positive-channel MOSFET 602 and the example current multiplier 504 includes a fourth positive-channel MOSFET 604.

In the illustrated example of FIG. 6, the example current sensor 502 is coupled to the first voltage node $V_{SUPPLY}$, the example current multiplier 504, and the example voltage follower 104. In the illustrated example, the example current multiplier 504 is coupled to the first voltage node $V_{SUPPLY}$, the example current sensor 502, and the fifth voltage node $V_{CLAMP}$. In the example, the example voltage-controlled switch 102 is coupled to the biasing current source 108 $I_{BIAS}$, the second voltage node $V_{OUT\_H}$, the third voltage node $V_{INT}$, and the fifth voltage node $V_{CLAMP}$. In the illustrated example, the example voltage follower 104 is coupled to the example current sensor 502, the fourth voltage node $V_{REF}$, the example clamper 106, and the sixth voltage node GND. The example clamper 106 is coupled to the fifth voltage node $V_{CLAMP}$ and the example voltage follower 104. The example biasing current source 108 $I_{BIAS}$ is coupled to the first voltage node $V_{SUPPLY}$ and the example voltage-controlled switch 102. The example current source 110 $I_B$ is coupled to the example fifth voltage node $V_{CLAMP}$ and the sixth voltage node GND.

In the schematic illustration of FIG. 6, the first voltage node $V_{SUPPLY}$ is a voltage node connected to a voltage source. The voltage source provides a source of power to the component level clamping circuit 600. In the illustrated example, the second voltage node $V_{OUT\_H}$ is a voltage node at which one or more devices are to be coupled to the component level clamping circuit 600. Example devices include ICs, IGBTs, MOSFETs, BJTs, JFETs, and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the schematic illustration of FIG. 6, the third voltage node $V_{INT}$ is a voltage node at which one or more devices are to be coupled to the component level clamping circuit 600. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements.

In the schematic illustration of FIG. 6, the example voltage-controlled switch 102 is implemented by the example first positive-channel MOSFET 202, the example parasitic diode 204, and the example resistor 206. In the schematic illustration, the first positive-channel MOSFET 202 includes an example first drain (e.g., a current terminal), an example first gate, and an example first source (e.g., a current terminal). The example parasitic diode 204 is coupled in parallel with the example first positive-channel MOSFET 202 from the example first drain to the example first source. The example resistor 206 is coupled between the example gate and the example first source. In the schematic illustration, the example first source is coupled to the third voltage node $V_{INT}$ and the example first drain is coupled to the fourth voltage node $V_{OUT\_H}$. The example first source is also coupled to the example biasing current source 108. The example gate is coupled the fifth voltage node $V_{CLAMP}$.

In the schematic illustration of FIG. 6, the voltage level at the first source of the first positive-channel MOSFET 202 is set by the example biasing current source 108 $I_{BIAS}$. For example, the biasing current source 108 $I_{BIAS}$ injects a current into the example first source of the first positive-channel MOSFET 202. The current injected by the example biasing current source 108 $I_{BIAS}$ ensures that the majority of the first current $I_{OUT\_H}$ flows from the example first drain to the example first source of the first positive-channel MOSFET 202 as opposed to through the parasitic diode 204. The voltage drop across the example resistor 206 sets the voltage level at the fifth voltage node $V_{CLAMP}$. The voltage drop across the example resistor 206 sets the gate-to-source voltage for the example first positive-channel MOSFET 202 to enable the example first positive-channel MOSFET 202. Thus, in the illustrated example, the first positive-channel MOSFET 202 conducts current (e.g., approximately $I_{OUT\_H}$) flowing from the second voltage node $V_{OUT\_H}$ to the fifth voltage node $V_{CLAMP}$ through the resistor 206 when the voltage level at the second voltage node $V_{OUT\_H}$ is above a threshold value. Additionally, the parasitic diode 204 conducts current flowing from the second voltage node $V_{OUT\_H}$ to the fifth voltage node $V_{CLAMP}$ through the resistor 206 when the voltage level at the second voltage node $V_{OUT\_H}$ is above a threshold value. Furthermore, when the voltage level at the second voltage node $V_{OUT\_H}$ is below a threshold value, neither the first positive-channel MOSFET 202 nor the parasitic diode 204 conduct current.

In the schematic illustration of FIG. 6, the example voltage follower 104 is implemented by the example first negative-channel MOSFET 208 and the example second positive-channel MOSFET 210. The example first negative-channel MOSFET 208 includes a second source (e.g., a current terminal), a second gate, and a second drain (e.g., a current terminal) and the example second positive-channel MOSFET 210 includes a third source (e.g., a current terminal), a third gate, and a third drain (e.g., a current terminal). In the schematic illustration, the second drain of the first negative-channel MOSFET 208 is coupled to current sensor 502. The current flowing from the current sensor 502 to the second drain of the example first negative-channel MOSFET 208 is the fourth current $I_X$. The second gate of the example first negative-channel MOSFET 208 and the third gate of the example second positive-channel MOSFET 210 are coupled to the fourth voltage node $V_{REF}$. The second source of the example first negative-channel MOSFET 208 and the third source of the example second positive-channel MOSFET 210 are coupled to the example second negative-channel MOSFET 212. The third drain of the example second positive-channel MOSFET 210 is coupled to the sixth voltage node GND.

In the schematic illustration of FIG. 6, the voltage level at the fourth voltage node $V_{REF}$ sets the gate-to-source voltage level for the example first negative-channel MOSFET 208. In the example schematic illustration, the example second positive-channel MOSFET 210 is not enabled because the gate-to-source voltage level is not met by the voltage level at fourth voltage node $V_{REF}$. Additionally, the voltage level at the fourth voltage node $V_{REF}$ sets the voltage level at the second source of the first negative-channel MOSFET 208 to be the voltage level at the fourth voltage node $V_{REF}$ minus the gate-to-source voltage drop of the first negative-channel MOSFET 208 ($V_{REF}-V_{GS}$).

In the schematic illustration of FIG. 6, the clamper 106 is implemented by a second negative-channel MOSFET 212 and a parasitic PNP BJT 214. In the example, the second negative-channel MOSFET 212 is a high voltage LDMOS-FET. In other examples, the second negative-channel MOSFET 212 is a high voltage DEMOSFET, or any other suitable transistor to clamp the voltage level at the fifth voltage node $V_{CLAMP}$. The example second negative-channel MOSFET 212 includes a fourth source (e.g., a current terminal), a fourth gate, a fourth drain (e.g., a current terminal), a back-gate terminal (e.g., a current terminal), and a back-gate terminal (e.g., a current terminal). The fourth source of the second negative-channel MOSFET 212 is coupled to the fourth gate of the second negative-channel MOSFET 212, the back-gate terminal of the second negative-channel MOSFET 212, the second source of the first negative-channel MOSFET 208, and the third source of the second positive-channel MOSFET 210. The drain of the second negative-channel MOSFET 212 is coupled to the fifth voltage node $V_{CLAMP}$. The parasitic PNP BJT 214 includes an emitter (e.g., a current terminal), a base (e.g., a current terminal), and a collector (e.g., a current terminal). The emitter of the parasitic PNP BJT 214 is coupled to the fourth gate of the example second negative-channel MOSFET 212. The base of the parasitic PNP BJT 214 is coupled to the fifth voltage node $V_{CLAMP}$. The collector of the parasitic PNP BJT 214 is coupled to the sixth voltage node GND. The parasitic PNP BJT 214 results from a parasitic back-gate-to-drain diode included in the second negative-channel MOSFET 212 and a parasitic drain-to-substrate diode included in the second negative-channel MOSFET 212. The current flowing out of the collector of the parasitic PNP BJT 214 is a sixth current $I_{SUB}$. The current flowing out of the base of the parasitic PNP BJT 214 is the fifth current $I_Y$. Because the fourth gate and the fourth source of the example second negative-channel MOSFET 212 are coupled to one another, the example second negative-channel MOSFET 212 does not conduct current. The sixth current $I_{SUB}$ is equal to the gain coefficient (β) of the parasitic PNP BJT 214 multiplied by the fifth current $I_Y$ ($I_{SUB}=\beta*I_Y$).

In the example of FIG. 6, the example clamper 106 is a circuit that clamps a voltage node to a desired voltage level. More specifically, the parasitic back-gate-to-drain diode of the second negative-channel MOSFET 212 clamps the voltage level at the fifth voltage node $V_{CLAMP}$. The parasitic back-gate-to-drain diode of the second negative-channel MOSFET 212 clamps the voltage level at the fifth voltage node $V_{CLAMP}$ when the voltage level at the second voltage node $V_{OUT\_H}$ is below a threshold value. More specifically, the parasitic PNP BJT 214 injects current (e.g., the fifth current $I_Y$) into the fifth voltage node $V_{CLAMP}$ to supply the current source 110 $I_B$. The parasitic PNP BJT 214 clamps the voltage level at the fifth voltage node $V_{CLAMP}$ to protect the first positive-channel MOSFET 202 and therefore to ensure proper functionality of the one or more devices and/or circuitry coupled to the first positive-channel MOSFET 202.

For example, when the first positive-channel MOSFET 202 is coupled to a gate of an IGBT at the second voltage node $V_{OUT\_H}$, the voltage level at the second voltage node $V_{OUT\_H}$ varies to control the IGBT. In such an example, if the IGBT is controlled to be conducting the second voltage node $V_{OUT\_H}$ is high. In such an example, the voltage level at the fifth voltage node $V_{CLAMP}$ is equal to the voltage level at the second voltage node $V_{OUT\_H}$ minus the voltage drop across the first positive-channel MOSFET 202 and the voltage drop across the resistor 206 (e.g., $V_{CLAMP}=V_{OUT\_H}-V_{204}-V_{206}$). If the voltage level at the second voltage node $V_{OUT\_H}$ goes below a threshold value, the first positive-channel MOSFET 202 is disabled. In such an example, the threshold value that disables the first positive-channel MOSFET 202 and enables the clamper 106 is the voltage level at the fourth voltage node $V_{REF}$ minus the voltage drop from the gate to source of the first negative-channel MOSFET 208 and the voltage drop across the second negative-channel MOSFET 212 (e.g., $V_{CLAMP}=V_{REF}-V_{GS,\,208}-V_{212}$). If the first positive-channel MOSFET 202 is disabled (e.g., abruptly disabled), one or more devices coupled to the third voltage node $V_{INT}$ may experience transient voltage and current events that may damage and/or destroy the first positive-channel MOSFET 202 and/or the one or more devices coupled to the third voltage node $V_{INT}$. Therefore, it is advantageous to clamp the voltage level at that controls the first positive-channel MOSFET 202 to prevent damage to circuitry and/or one or more devices.

In one example, the parasitic PNP BJT 214 sets a limit for the voltage level at the fifth voltage node $V_{CLAMP}$, the limit to prevent the voltage level at the fifth voltage node $V_{CLAMP}$ from operating below the limit. For example, the voltage level at the fifth voltage node $V_{CLAMP}$ tracks the voltage level at the second voltage node $V_{OUT\_H}$ and when the voltage level at the second voltage node $V_{OUT\_H}$ is below a threshold value, the parasitic PNP BJT 214 clamps the voltage level at the fifth voltage node $V_{CLAMP}$ to a voltage level defined by the voltage drop across the back-gate-to-drain diode of the parasitic PNP BJT 214. For example, the voltage level at the gate of the second negative-channel MOSFET 212 is equal to the voltage level at the fourth voltage node $V_{REF}$ (e.g., 12 volts (V)) minus the gate-to-source voltage drop of the first negative-channel MOSFET 208 (e.g., 3 V). In this example, the parasitic PNP BJT 214 clamps the voltage level at the fifth voltage node $V_{CLAMP}$ to the voltage level at the gate of the second negative-channel MOSFET 212 (e.g., 9 V) minus the voltage drop across the parasitic back-gate-to-drain diode of the parasitic PNP BJT 214 included in the second negative-channel MOSFET 212 (e.g., 0.7 V).

In such an example, the parasitic PNP BJT 214 clamps the voltage at the fifth voltage node $V_{CLAMP}$ by injecting a current (e.g., the fifth current $I_Y$) into the fifth voltage node $V_{CLAMP}$. When the voltage level at the second voltage node $V_{OUT\_H}$ is above a threshold value, the parasitic PNP BJT 214 does not inject current (e.g., the fifth current $I_Y$) into the fifth voltage node $V_{CLAMP}$. However, when the voltage level at the second voltage node $V_{OUT\_H}$ is below a threshold value, the parasitic PNP BJT 214 injects current (e.g., the fifth current $I_Y$) into the fifth voltage node $V_{CLAMP}$.

In the illustrated example of FIG. 6, the current sensor 502 is implemented by the third positive-channel MOSFET 602. The third positive-channel MOSFET 602 includes a fifth source (e.g., a current terminal), a fifth gate, and a fifth drain (e.g., a current terminal). In the example, the fifth source of the third positive-channel MOSFET 602 is coupled to the first voltage node $V_{SUPPLY}$. In the example, the fifth gate of the third positive-channel MOSFET 602 is coupled to the fifth source of the third positive-channel MOSFET 602 and the fifth source of the third positive-channel MOSFET 602 is coupled to the second drain of the first negative-channel MOSFET 208. In the example, the example third positive-channel MOSFET 602 senses the fourth current $I_X$ flowing between the current sensor 502 and the example voltage follower 104. The fourth current $I_X$ is equal to the fifth current $I_Y$ plus the sixth current $I_{SUB}$ (e.g., $I_X=I_Y+I_{SUB}=I_Y+\beta*I_Y=(1+\beta)*I_Y$).

In the illustrated example of FIG. 6, the current multiplier 504 is implemented by the fourth positive-channel MOSFET 604. The fourth positive-channel MOSFET 604 includes a sixth source (e.g., a current terminal), a sixth gate, and a sixth drain (e.g., a current terminal). In the example, the sixth drain of the fourth positive-channel MOSFET 604 is coupled to the first voltage node $V_{SUPPLY}$. In the example, the sixth gate of the fourth positive-channel MOSFET 604 is coupled to the fifth gate of the third positive-channel MOSFET 602 and the sixth drain of the fourth positive-channel MOSFET 604 is coupled to the fifth voltage node $V_{CLAMP}$. In the example, the fourth positive-channel MOSFET 604 outputs a current (e.g., a seventh current $I_N$) proportional by a ratio (1:N) to the sensed current (e.g., the fourth current $I_X$) (e.g., $IN=N*I_X$). In the illustrated example, the current multiplier 504 is to output a current (e.g., the seventh current $I_N$), the current (e.g., the seventh current $I_N$) to reduce a leakage current through the parasitic PNP BJT 214. For example, the leakage current is undesired current flowing from the source of the second negative-channel MOSFET 212 to the sixth voltage node GND. Together, the third positive-channel MOSFET 602 and the fourth positive-channel MOSFET 604 make up a MOSFET current mirror. Moreover, the current flowing between the example source of the second negative-channel MOSFET 212 and the sixth voltage node GND is reduced by the seventh current $I_N$ caused by the fourth positive-channel MOSFET 604.

In the illustrated example, the ratio governing the proportional relationship between the fourth current $I_X$ and the seventh current $I_N$ (e.g., 1:N) is based on the size of the third positive-channel MOSFET 602 and the fourth positive-channel MOSFET 604. In the example, the ratio (1:N) may be based on the channel width of the positive-channel MOSFET transistor used for the third positive-channel MOSFET 602 and the channel width of the fourth positive-channel MOSFET 604. In the example the channel width of the fourth positive-channel MOSFET 604 is N times larger than the channel width of the third positive-channel MOSFET 602.

In the illustrated example of FIG. 6, when the voltage level at the second voltage node $V_{OUT\_H}$ is below a threshold value, the clamper 106 is active. In examples where the clamper 106 is active, the parasitic PNP BJT 214 injects the fifth current $I_Y$ into the fifth voltage node $V_{CLAMP}$ via the base of the parasitic PNP BJT 214. In such an example, the fifth current $I_Y$ is equal to the fourth current $I_X$ minus the sixth current $I_{SUB}$ (e.g., $I_Y = I_X - I_{SUB}$). Therefore, the fourth current $I_X$ equals the fifth current $I_Y$ plus the seventh current $I_{SUB}$ (e.g., $I_X = I_Y + I_{SUB} = I_Y + \beta * I_Y = (1+\beta)*I_Y$).

In the illustrated example of FIG. 6, the current source 110 $I_B$ is a current source that is based on the current flowing from the fifth voltage node $V_{CLAMP}$ to the sixth voltage node GND. In other words, the current source 110 $I_B$ is based on the third current IA and the fifth current $I_Y$. In some examples the current source 110 $I_B$ is a portion of a current mirror. In other examples, the current source 110 $I_B$ is implemented as a constant current diode, a Zener diode current source, an operation amplifier current source, a voltage regulator current source, or any other type of suitable current source.

In the example of FIG. 6, when the clamper 106 is clamping, the current source 110 $I_B$ is dependent on the fifth current $I_Y$ and the seventh current $I_N$. As the current sourced by the current source 110 $I_B$ increases, the seventh current $I_N$ supplies the majority of the current to the current source 110 $I_B$ as shown in equations 1, 2, 3, 4, and 5 below.

$$I_B = I_Y + I_N = \frac{I_X}{(1+\beta)} + N * I_X = I_X * \left(\frac{1}{(1+\beta)} + N\right) \quad \text{Equation-1}$$

$$(1+\beta)*I_B = I_X *(1+N*(1+\beta)) \quad \text{Equation-2}$$

$$I_X = \frac{I_B*(1+\beta)}{(1+N*(1+\beta))} = I_Y*(1+\beta) \quad \text{Equation-3}$$

$$I_Y = \frac{I_B}{(1+N*(1+\beta))} \quad \text{Equation-4}$$

$$I_{SUB} = \beta*I_Y = \frac{\beta*I_B}{(1+N*(1+\beta))} \quad \text{Equation-5}$$

As shown in equation 5, the sixth current $I_{SUB}$ does not contribute to the majority of the current sourced by the current source 110 $I_B$ due to the proportional ratio between the fourth current $I_X$ and the seventh current $I_N$. Because of the current sensor 502 and the current multiplier 504, more specifically, the third positive-channel MOSFET 602 and the fourth positive-channel MOSFET 604, respectively, the leakage current caused by the parasitic PNP BJT 214 is reduced. In examples where the gain factor, $\beta$, of the parasitic PNP BJT 214 is large (e.g., $\beta \gg 1$), the leakage current through the parasitic PNP BJT 214 is reduced significantly such that the leakage current is almost completely attenuated. In examples where the gain factor, $\beta$, of the parasitic PNP BJT 214 is small (e.g., $0 > \beta > 1$), the leakage current through the parasitic PNP BJT 214 is still reduced by a factor of (1+N).

Figure 7:
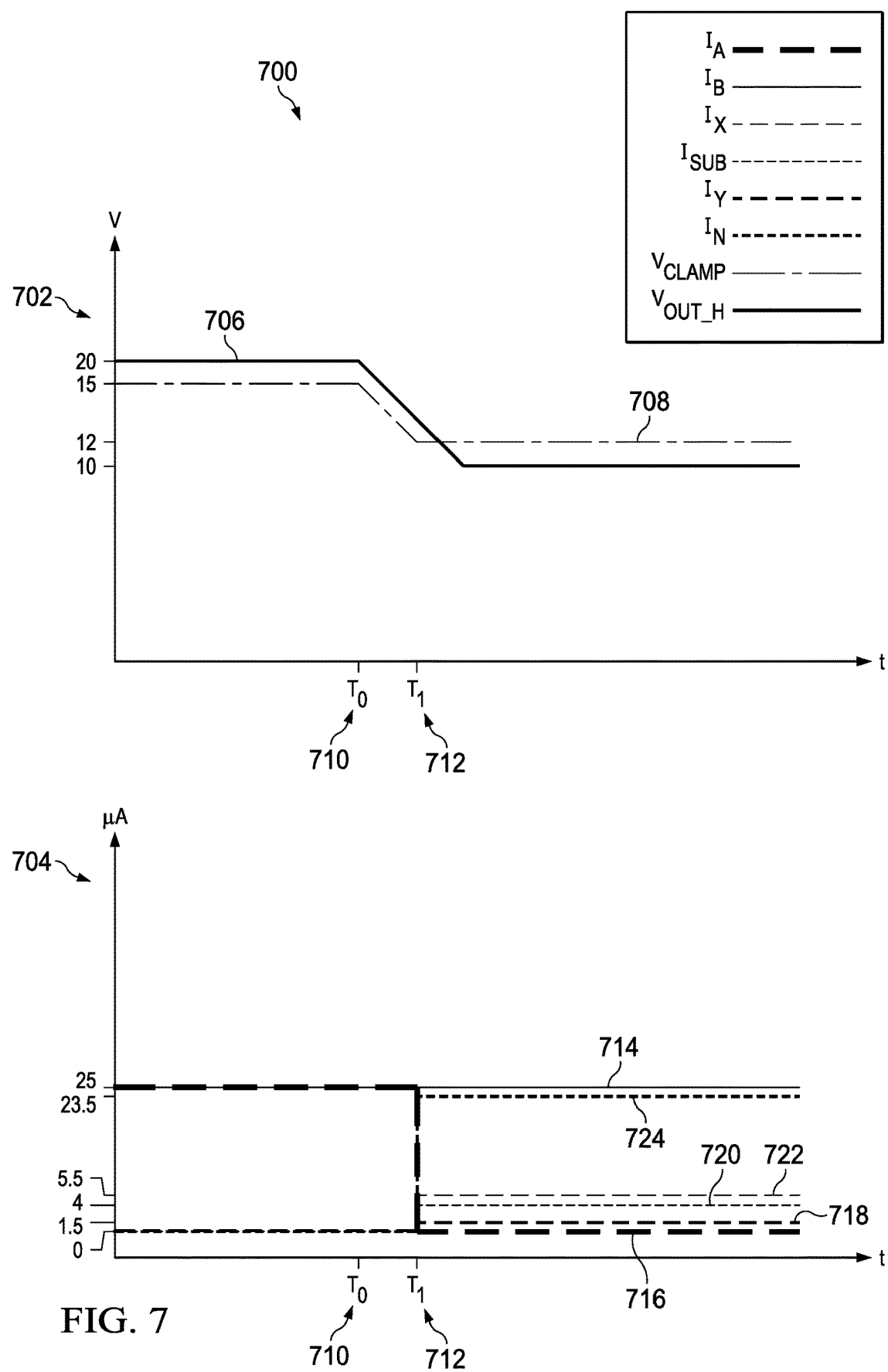
FIG. 7 is a graphical illustration of various voltage levels and current level versus time associated with the example clamping circuit of FIG. 6.

FIG. 7 is a graphical illustration of various voltage levels and current level versus time associated with the example component level clamping circuit 600 of FIG. 6. FIG. 7 includes a voltage plot 702 and a current plot 704. The voltage plot 702 illustrates various voltages levels versus time in the component level clamping circuit 600 versus time. The voltage plot 702 includes a first curve 706, a second curve 708, a first time 710 ($T_0$), and a second time 712 ($T_1$). The first curve 706 represents the voltage level at the second voltage node $V_{OUT\_H}$ of the component level clamping circuit 600. The second curve 708 represents the voltage level at the fifth voltage plot $V_{CLAMP}$ of the component level clamping circuit 600. The first time 710 $T_0$ represents a time at which the voltage level at the second voltage node $V_{OUT\_H}$ begins to decrease from its current voltage level. The second time 712 $T_1$ represents a time at which the voltage level at the fifth voltage node $V_{CLAMP}$ reaches a threshold value.

The current plot 704 illustrates various current levels versus time in the component level clamping circuit 600 versus time. The current plot 704 includes a third curve 714, a fourth curve 716, a fifth curve 718, a sixth curve 720, a seventh curve 722, an eighth curve 724, the first time 710 $T_0$, and the second time 712 $T_1$. The third curve 714 represents the current source 110 $I_B$. The fourth curve 716 represents the third current IA. The fifth curve 718 represents the fifth current $I_Y$. The sixth curve 720 represents the sixth current $I_{SUB}$. The seventh curve 722 represents the fourth current $I_X$. The eighth curve 724 represents the seventh current $I_N$.

In the illustrated example of FIG. 7, before the first time 710 $T_0$, the example first curve 706 is at a voltage level of 20 V, the example second curve 708 is at a voltage level of 15 V, the example third curve 714 is at a current level of 25 μA, the example fourth curve 716 is at a current level of 25 μA, the example fifth curve 718 is at a current level of 0 μA, the example sixth curve 720 is at a current level of 0 μA, the example seventh curve 722 is at a current level of 0 μA, and the example eighth curve 724 is at a current level of 0 μA. At the first time 710 $T_0$, the example first curve 706 begins to transition from a voltage level of 20 V to a voltage level of 10 V and the example second curve 708 begins to transition from a voltage level of 15 V to a voltage level of 12 V.

At the second time 712 $T_1$, the example clamper 106 clamps the voltage level at the fifth voltage node $V_{CLAMP}$ to a threshold value. At the second time 712 $T_1$, the example first curve 706 continues to transition from 20 V to 10 V. At the second time 712 $T_1$, the voltage level of the example first curve 706 is 17 V. At the second time 712 $T_1$, the example second curve 708 is at a voltage level of 12 V, the example third curve 714 is at a current level of 25 μA, the example fourth curve 716 begins to transition from a current of 25 μA to a current level of 0 μA, the example fifth current curve 718 begins to transition from a current level of 0 μA to a current level of 1.5 μA, the example sixth curve 720 begins to transition from a current level of 0 μA to a current level of 4 μA, the example seventh curve 722 begins to transition from a current level of 0 μA to a current level of 5.5 μA, and the example eighth curve 724 is at a current level of 23.5 μA.

After the second time 712 $T_1$, the clamper 106 continues to clamp the voltage level at the fifth voltage node $V_{CLAMP}$ to the threshold value. After the second time 712 $T_1$, the example first curve 706 continues to transition from a voltage level of 20 V to a voltage level of 10 V and maintains a voltage level of 10 V, the example second curve 708 maintains a voltage level of 10 V, the example third curve 714 maintains a current level of 25 μA, the example fourth curve 716 maintains a current level of 0 μA, the example fifth curve 718 maintains a current level of 1.5 μA, the example sixth curve 720 maintains a current level of 4 μA, the example seventh curve 722 maintains a current level of 5.5 μA, and the example eighth curve 724 maintains a current level of 23.5 μA.

In such an example as illustrated in FIG. 7, the current supplied to the fifth voltage node $V_{CLAMP}$ by the example current multiplier 504 (e.g., the example fourth positive-channel MOSFET 604) supplies the majority of the current sourced by the current source 110 $I_B$. The current level of the sixth current $I_{SUB}$ is sufficiently low (e.g., 4 μA) to prevent the second negative-channel MOSFET 212 from experiencing a latch-up event. Thus, the seventh current $I_N$ supplied by the example current multiplier 504 (e.g., the example fourth positive-channel MOSFET 604) prevents latch-up events that can damage and/or destroy the second negative-channel MOSFET 212 and/or one or more devices or circuitry coupled to the second voltage node $V_{OUT\_H}$ and the third voltage node $V_{INT}$.

Figure 8:
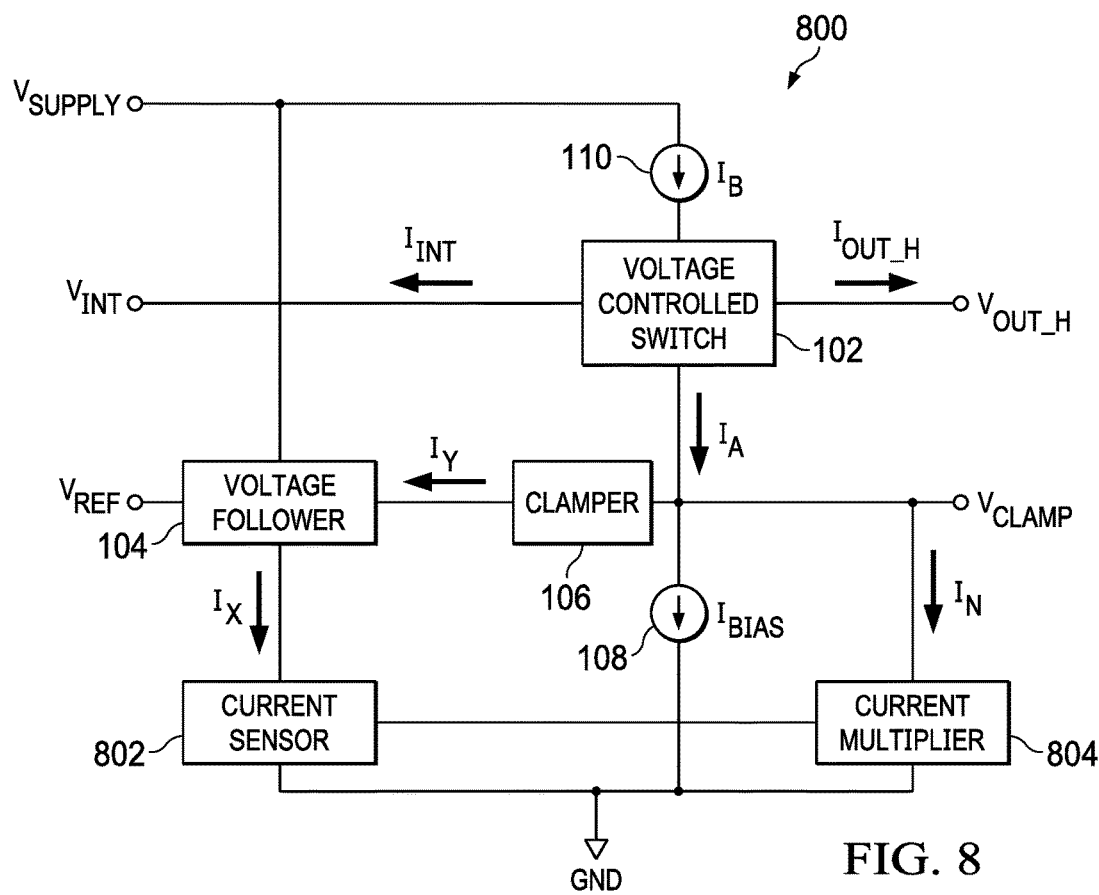
FIG. 8 is a block diagram of an alternative example clamping circuit including a current sensor and a current multiplier.

FIG. 8 is a block diagram of an alternative example clamping circuit 800 including a current sensor 802 and a current multiplier 804. The clamping circuit 800 includes the example voltage-controlled switch 102, the example voltage follower 104, the example clamper 106, the example biasing current source 108 ($I_{BIAS}$), the example current source 110 ($I_B$), the example first voltage node ($V_{SUPPLY}$), the example second voltage node ($V_{OUT\_H}$), the example third voltage node ($V_{INT}$), the example fourth voltage node ($V_{REF}$), the example fifth voltage node ($V_{CLAMP}$), and the example sixth voltage node (GND) of FIG. 1.

In the illustrated example of FIG. 8, the example current sensor 802 is coupled to the sixth voltage node GND, the example current multiplier 804, and the example voltage follower 104. In the illustrated example, the example current multiplier 804 is coupled to the sixth voltage node GND, the example current sensor 802, and the fifth voltage node $V_{CLAMP}$. In the example, the example voltage-controlled switch 102 is coupled to the current source 110 $I_B$, the second voltage node $V_{OUT\_H}$, the third voltage node $V_{INT}$, and the fifth voltage node $V_{CLAMP}$. In the illustrated example, the example voltage follower 104 is coupled to the example current sensor 802, the fourth voltage node $V_{REF}$, the example clamper 106, and the first voltage node $V_{SUPPLY}$. The example clamper 106 is coupled to the fifth voltage node $V_{CLAMP}$ and the example voltage follower 104. The example biasing current source 108 $I_{BIAS}$ is coupled to the sixth voltage node GND and the fifth voltage node $V_{CLAMP}$. The example current source 110 $I_B$ is coupled to the example fifth voltage node $V_{CLAMP}$ and the sixth voltage node GND.

In the illustrated example of FIG. 8, the first voltage node $V_{SUPPLY}$ is a voltage node connected to a voltage source. The voltage source provides a source of power to the clamping circuit 800. In the illustrated example, the second voltage node $V_{OUT\_H}$ is a voltage node at which one or more devices are to be coupled to the clamping circuit 500. Example devices include ICs, IGBTs, MOSFETs, BJTs, JFETs, and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the illustrated example of FIG. 8, the third voltage node $V_{INT}$ is a voltage node at which one or more devices are to be coupled to the clamping circuit 800. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements.

In the illustrated example of FIG. 8, the voltage-controlled switch 102 is an electrical switch that controls conduction between the first voltage node $V_{SUPPLY}$ and the second voltage node $V_{OUT\_H}$. In some examples, the voltage-controlled switch 102 is a diode. In other examples, the voltage-controlled switch 102 is a parasitic body diode of a transistor. In further examples, the voltage-controlled switch 102 is a transistor. In additional examples, the voltage-controlled switch 102 is a combination of a transistor and the parasitic body diode of the transistor. In the illustrated example, the voltage-controlled switch 102 is controlled by a voltage drop between a first voltage level at the current source 110 $I_B$ and a second voltage level at the second voltage node $V_{OUT\_H}$. In the illustrated example, the current flowing between the example voltage-controlled switch 102 and the fifth voltage node $V_{CLAMP}$ is a third current IA.

In the illustrated example of FIG. 8, the fourth voltage node $V_{REF}$ is a voltage node at which a voltage level is applied. The voltage level is a reference voltage level for a desired voltage level at the fifth voltage node $V_{CLAMP}$. In the illustrated example of FIG. 8, the example voltage follower 104 is a circuit that isolates the fourth voltage node $V_{REF}$ from the other elements of the clamping circuit 800. The current flowing between the example current sensor 802 and the example voltage follower 104 is a fourth current $I_X$.

In the illustrated example of FIG. 8, the example clamper 106 is a circuit that clamps a voltage node to a desired voltage level. In some examples, the clamper 106 is a combination of a MOSFET and a parasitic component such as a diode. In other examples, the clamper is a diode, such as a Schottky diode. The current flowing from the clamper 106 to the fifth voltage node $V_{CLAMP}$ is a fifth current $I_Y$. The clamper 106 clamps the voltage level at a voltage node when the voltage is below a threshold value. The clamper 106 clamps the voltage level at the fifth voltage node $V_{CLAMP}$ to protect the voltage-controlled switch 102 and therefore to ensure proper functionality of the one or more devices coupled to the voltage-controlled switch 102.

For example, when the voltage-controlled switch 102 is coupled to a gate of an IGBT at the second voltage node $V_{OUT\_H}$, the voltage level at the second voltage node $V_{OUT\_H}$ varies to control the IGBT. In such an example, if the voltage level at the second voltage node $V_{OUT\_H}$ goes above a threshold value, the voltage-controlled switch 102 is disabled. If the voltage-controlled switch 102 is disabled (e.g., abruptly disabled), one or more devices coupled to the third voltage node $V_{INT}$ may experience transient voltage and current events that may damage and/or destroy the voltage-controlled switch 102 and/or the one or more devices coupled to the third voltage node $V_{INT}$. Therefore, it is advantageous to clamp the voltage level at the fifth voltage node $V_{SUPPLY}$ to prevent damage to circuitry and/or one or more devices.

In the example, the clamper 106 sets a limit for the voltage level at the fifth voltage node $V_{CLAMP}$, the limit to prevent the voltage level at the fifth voltage node $V_{CLAMP}$ from operating above the limit. For example, the voltage level at the fifth voltage node $V_{CLAMP}$ tracks the voltage level at the second voltage node $V_{OUT\_H}$ and when the voltage level at the second voltage node $V_{OUT\_H}$ is above a threshold value, the clamper 106 clamps the voltage level at the fifth voltage node $V_{CLAMP}$ to a voltage level defined by the clamper 106. In this example, the clamper 106 clamps the voltage level at the fifth voltage node $V_{CLAMP}$ by drawing a current (e.g., the fifth current $I_Y$) from the fifth voltage node $V_{CLAMP}$. When the voltage level at the second voltage node $V_{OUT\_H}$ is below a threshold value, the clamper 106 does not draw current (e.g., the fifth current $I_Y$) from the fifth voltage node $V_{CLAMP}$. However, when the voltage level at the second voltage node $V_{OUT\_H}$ is above a threshold value, the clamper 106 draws current (e.g., the fifth current $I_Y$) from the fifth voltage node $V_{CLAMP}$. In some examples, the clamper 106 includes parasitic components that cause leakage current (e.g., a sixth current $I_{LEAK}$) in the clamper 106.

In the illustrated example of FIG. 8, the current sensor 802 is a device that senses the fourth current $I_X$ flowing between the current sensor 502 and the example voltage follower 104. In some examples, the current sensor 802 is a portion of a current mirror (e.g., a MOSFET). In other examples, the current sensor 802 is a current shunt, a Hall effect sensor, a fiber optic current sensor, a Rogowski coil, or any other type of suitable current sensor.

In the illustrated example of FIG. 8, the current multiplier 804 is a device that outputs a current (e.g., a seventh current $I_N$) proportional by a ratio (1:N) to the sensed current (e.g., IN=N*$I_X$). In some examples, the current multiplier 804 is a current controlled current source (e.g., a portion of a current mirror, a MOSFET, etc.). In other examples, the current multiplier 804 is a class B amplifier, a class AB amplifier, or any other type of current multiplier that is suitable for the application. In the illustrated example, the current multiplier 804 is to output a current (e.g., the seventh current $I_N$), the current (e.g., the seventh current $I_N$) to reduce a leakage current through a parasitic component in the clamper 106. In other words, the current multiplier 804 is to output a current (e.g., the seventh current $I_N$) to reduce the current flowing from the clamper 106 to the sixth voltage node GND.

In the illustrated example of FIG. 8, when the voltage level at the second voltage node $V_{OUT\_H}$ is above a threshold value, the clamper 106 is active. In examples where the clamper 106 is active, the fourth current $I_X$ is equal to the fifth current $I_Y$ plus the sixth current $I_{LEAK}$ ($I_X=I_Y+I_{LEAK}$) caused by parasitic components in the example clamper 106.

In the illustrated example of FIG. 8, the current source 110 $I_B$ is a current source that causes current to from the voltage-controlled switch 102 and the second voltage node $V_{OUT\_H}$ and between the voltage-controlled switch 102 and the fifth voltage node $V_{CLAMP}$. In other words, the current source 110 $I_B$ causes the first current $I_{OUT\_H}$ and the third current IA. In some examples the current source 110 $I_B$ is a portion of a current mirror. In other examples, the current source 110 $I_B$ is implemented as a constant current diode, a Zener diode current source, an operation amplifier current source, a voltage regulator current source, or any other type of suitable current source.

In the example of FIG. 8, when the clamper 106 is clamping, the current source 110 $I_B$ causes the third current $I_A$. The third current $I_A$ causes the fifth current $I_Y$ and seventh current $I_N$. As the current sourced by the current source 110 $I_B$ increases, the seventh current $I_N$ is the majority of the current from the current source 110 $I_B$. Thus, the current (e.g., the sixth current $I_{LEAK}$) caused by parasitic components does not contribute to the majority of the current sourced by the current source 110 $I_B$ due to the proportional ratio between the fourth current $I_X$ and the seventh current $I_N$. Therefore, the sixth current $I_{LEAK}$ is thereby reduced by the seventh current $I_N$. Moreover, the current flowing between the example clamper 106 and the sixth voltage node GND is reduced by the seventh current $I_N$ caused by the current multiplier 804.

Figure 9:
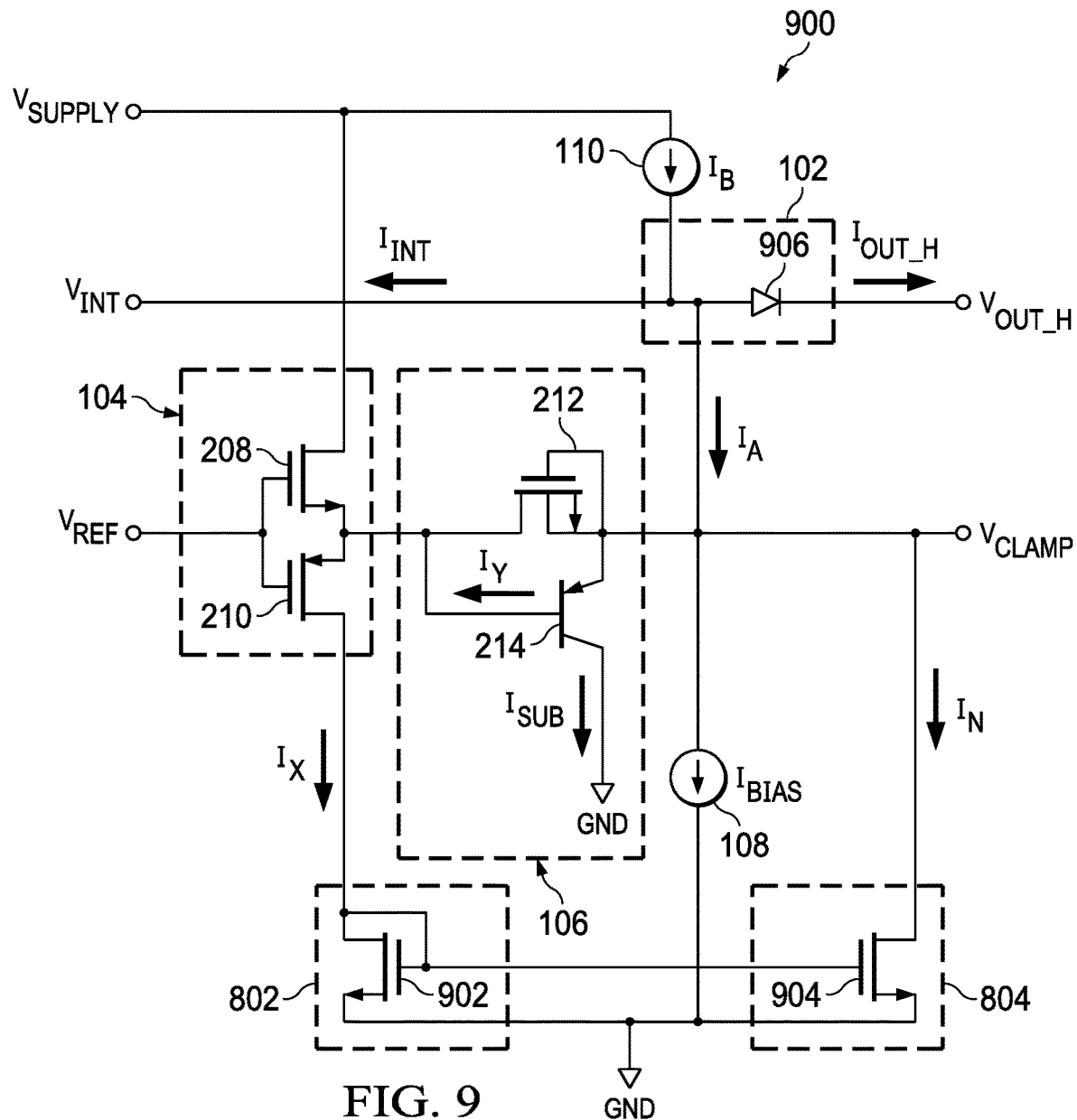
FIG. 9 is a schematic illustration of the example component level clamping circuit to implement the clamping circuit of FIG. 8.

FIG. 9 is a schematic illustration of the example component level clamping circuit 900 to implement the clamping circuit 800 of FIG. 8. The component level clamping circuit 900 includes an example current sensor 802, an example current multiplier 804, the example voltage-controlled switch 102, the example voltage follower 104, the example clamper 106, the example biasing current source 108 ($I_{BIAS}$), the example current source 110 ($I_B$), the example first voltage node ($V_{SUPPLY}$), the example second voltage node ($V_{OUT\_H}$), the example third voltage node ($V_{INT}$), the example fourth voltage node ($V_{REF}$), the example fifth voltage node ($V_{CLAMP}$), and the example sixth voltage node (GND) of FIG. 1.

In the schematic illustration of FIG. 9, the example voltage-controlled switch 102 includes a diode 906. In the schematic illustration, the example voltage follower 104 includes the first negative-channel MOSFET 208 and the second positive-channel MOSFET 210 of FIG. 2. In the schematic illustration, the example clamper 106 includes the second negative-channel MOSFET 212 and the parasitic PNP BJT 214 of FIG. 2. In the schematic illustration, the example current sensor 802 includes a third negative-channel MOSFET 902 and the example current multiplier 804 includes a fourth negative-channel MOSFET 904. The voltage-controlled switch 102 includes an example diode 906.

In the illustrated example of FIG. 9, the example current sensor 802 is coupled to the sixth voltage node GND, the example current multiplier 804, and the example voltage follower 104. In the illustrated example, the example current multiplier 804 is coupled to the sixth voltage node GND, the example current sensor 802, and the fifth voltage node $V_{CLAMP}$. In the example, the example voltage-controlled switch 102 is coupled to the current source 110 $I_B$, the second voltage node $V_{OUT\_H}$, the third voltage node $V_{INT}$, and the fifth voltage node $V_{CLAMP}$. In the illustrated example, the example voltage follower 104 is coupled to the example current sensor 802, the fourth voltage node $V_{REF}$, the example clamper 106, and the first voltage node $V_{SUPPLY}$. The example clamper 106 is coupled to the fifth voltage node $V_{CLAMP}$ and the example voltage follower 104. The example biasing current source 108 $I_{BIAS}$ is coupled to the sixth voltage node GND and the fifth voltage node $V_{CLAMP}$. The example current source 110 $I_B$ is coupled to the example fifth voltage node $V_{CLAMP}$ and the first voltage node $V_{SUPPLY}$.

In the schematic illustration of FIG. 9, the first voltage node $V_{SUPPLY}$ is a voltage node connected to a voltage source. The voltage source provides a source of power to the component level clamping circuit 900. In the illustrated example, the second voltage node $V_{OUT\_H}$ is a voltage node at which one or more devices are to be coupled to the component level clamping circuit 900. Example devices include ICs, IGBTs, MOSFETs, BJTs, JFETs, and/or other transistors. In one example, at least one of the devices connected to the second voltage node $V_{OUT\_H}$ is the example switch 1106 discussed in further detail in FIG. 11. In the illustrated example, the current flowing between the second voltage node $V_{OUT\_H}$ and the voltage-controlled switch 102 is a first current $I_{OUT\_H}$.

In the schematic illustration of FIG. 9, the third voltage node $V_{INT}$ is a voltage node at which one or more devices are to be coupled to the component level clamping circuit 900. In the example, the third voltage node $V_{INT}$ is coupled to a high-impedance device. In one example, the high-impedance device is a gate of an example transistor. In such an example, the example transistor includes a MOSFET, an IGBT, a BJTs, a JFET, and/or another transistor. In further examples, the high-impedance device is a network of resistors, capacitors, inductors, diodes, an/or other circuit elements.

In the schematic illustration of FIG. 9, the example voltage-controlled switch 102 is implemented by the example diode 906. In the schematic illustration, the diode 906 includes an example anode (e.g., a current terminal) and an example cathode (e.g., a current terminal). In the schematic illustration, the example cathode of the example diode 906 is coupled to the second voltage node $V_{OUT\_H}$ and the example anode of the example diode 906 is coupled to the second voltage node $V_{INT}$ and the fifth voltage node $V_{CLAMP}$.

In the schematic illustration of FIG. 9, the voltage level at the anode of the diode 906 is set by the example current source 110 $I_B$ and the voltage level at the first voltage node $V_{OUT\_H}$. In some examples, the diode 906 is a parasitic diode coupled in parallel to a transistor (e.g., a MOSFET). In such an example, the biasing current source 108 $I_{BIAS}$ draws a current from the node at which the diode 906 and the example transistor are coupled. The current drawn from the node by the example biasing current source 108 $I_{BIAS}$ and the example current source 110 $I_B$ ensure that the majority of the first current $I_{OUT\_H}$ flows from the example first drain to the example transistor as opposed to through the diode 906. The voltage drop across the example diode 906 (e.g., from anode to cathode, from the fifth voltage node $V_{CLAMP}$ to the first voltage node $V_{OUT\_H}$) sets the voltage level at the fifth voltage node $V_{CLAMP}$. Thus, in the illustrated example, the diode 906 conducts current (e.g., approximately $I_{OUT\_H}$) flowing from the current source $I_B$ to the second voltage node $V_{OUT\_H}$ when the voltage at the second voltage node $V_{OUT\_H}$ is below a threshold. Furthermore, when the voltage level at the second voltage node $V_{OUT\_H}$ is above a threshold value, the example diode 906 does not conduct current.

In the schematic illustration of FIG. 9, the example voltage follower 104 is implemented by the example first negative-channel MOSFET 208 and the example second positive-channel MOSFET 210. The example first negative-channel MOSFET 208 includes a second source (e.g., a current terminal), a second gate, and a second drain (e.g., a current terminal) and the example second positive-channel MOSFET 210 includes a third source (e.g., a current terminal), a third gate, and a third drain (e.g., a current terminal). In the schematic illustration, the second drain of the first negative-channel MOSFET 208 is coupled to the first voltage node $V_{SUPPLY}$. The second gate of the example first negative-channel MOSFET 208 and the third gate of the example second positive-channel MOSFET 210 are coupled to the fourth voltage node $V_{REF}$. The second source of the example first negative-channel MOSFET 208 and the third source of the example second positive-channel MOSFET 210 are coupled to the example second negative-channel MOSFET 212. The third drain of the example second positive-channel MOSFET 210 is coupled to the current sensor 802.

In the schematic illustration of FIG. 9, the voltage level at the fourth voltage node $V_{REF}$ sets the gate-to-source voltage level for the example second positive-channel MOSFET 210. For example, the voltage at $V_{CLAMP}$ is equal to the voltage level at the fourth voltage node $V_{REF}$ plus the voltage drop across the second negative-channel MOSFET 212 plus the source to gate voltage drop of the second positive-channel MOSFET 210 (e.g., $V_{CLAMP}=V_{REF}+V_{212}+V_{SG,\ 210}$). In the example schematic illustration, the example first negative-channel MOSFET 208 is not enabled because the gate-to-source voltage level is not met by the voltage level at fourth voltage node $V_{REF}$. Additionally, the voltage level at the fourth voltage node $V_{REF}$ sets the voltage level at the second source of the first negative-channel MOSFET 208 to be the voltage level at the fourth voltage node $V_{REF}$ minus the gate-to-source voltage drop of the first negative-channel MOSFET 208 ($V_{REF}+V_{GS}$).

In the schematic illustration of FIG. 9, the clamper 106 is implemented by a second negative-channel MOSFET 212 which includes a parasitic PNP BJT 214. In the example, the second negative-channel MOSFET 212 is a high voltage LDMOSFET. In other examples, the second negative-channel MOSFET 212 is a high voltage DEMOSFET, or any other suitable transistor to clamp the voltage level at the fifth voltage node $V_{CLAMP}$. The example second negative-channel MOSFET 212 includes a fourth source (e.g., a current terminal), a fourth gate, a fourth drain (e.g., a current terminal), a back-gate terminal (e.g., a current terminal), and a back-gate terminal (e.g., a current terminal). The fourth source of the second negative-channel MOSFET 212 is coupled to the fourth gate of the second negative-channel MOSFET 212, the back-gate terminal of the second negative-channel MOSFET 212, the second source of the first negative-channel MOSFET 208, and the fifth voltage node $V_{CLAMP}$. The drain of the second negative-channel MOSFET 212 is coupled to the third source of the second positive-channel MOSFET 210. The parasitic PNP BJT 214 includes an emitter (e.g., a current terminal), a base (e.g., a current terminal), and a collector (e.g., a current terminal). The emitter of the parasitic PNP BJT 214 is coupled to the fourth gate of the example second negative-channel MOSFET 212. The base of the parasitic PNP BJT 214 is coupled to the third source of the second positive-channel MOSFET 210. The collector of the parasitic PNP BJT 214 is coupled to the sixth voltage node GND. The parasitic PNP BJT 214 results from a parasitic back-gate-to-drain diode included in the second negative-channel MOSFET 212 and a parasitic drain-to-substrate diode included in the second negative-channel MOSFET 212. The current flowing out of the collector of the parasitic PNP BJT 214 is a sixth current $I_{SUB}$. The current flowing out of the base of the parasitic PNP BJT 214 is the fifth current $I_Y$. Because the fourth gate and the fourth source of the example second negative-channel MOSFET 212 are coupled to one another, the example second negative-channel MOSFET 212 does not conduct current. The sixth current $I_{SUB}$ is equal to the gain coefficient (β) of the parasitic PNP BJT 214 multiplied by the fifth current $I_Y$ ($I_{SUB}=\beta*I_Y$).

In the example of FIG. 9, the example clamper 106 is a circuit that clamps a voltage node to a desired voltage level. More specifically, the parasitic back-gate-to-drain diode of the second negative-channel MOSFET 212 clamps the voltage level at the fifth voltage node $V_{CLAMP}$. The parasitic back-gate-to-drain diode of the second negative-channel MOSFET 212 clamps the voltage level at the fifth voltage node $V_{CLAMP}$ when the voltage level at the second voltage node $V_{OUT\_H}$ is above a threshold value. More specifically, the parasitic PNP BJT 214 draws current (e.g., the fifth current $I_Y$) from the fifth voltage node $V_{CLAMP}$ based on the current output by the current source 110 $I_B$. The parasitic PNP BJT 214 clamps the voltage level at the fifth voltage node $V_{CLAMP}$ to protect the diode 906 and therefore to ensure proper functionality of the one or more devices and/or circuitry coupled to the first positive-channel MOSFET 202.

For example, when the diode 906 is coupled to a gate of an IGBT at the second voltage node $V_{OUT\_H}$, the voltage level at the second voltage node $V_{OUT\_H}$ varies to control the IGBT. In such an example, if the IGBT is controlled to be conducting the second voltage node $V_{OUT\_H}$ is high. In such an example, the voltage level at the fifth voltage node $V_{CLAMP}$ is equal to the voltage level at the second voltage node $V_{OUT\_H}$ minus the voltage drop across the diode 906 (e.g., $V_{CLAMP}=V_{OUT\_H}-V_{906}$). If the voltage level at the second voltage node $V_{OUT\_H}$ goes above a threshold value, the diode 906 is disabled (e.g., does not conduct, is reverse biased). In such an example, the threshold value that disables the diode 906 and enables the clamper 106 is the voltage level at the fourth voltage node $V_{REF}$ minus the voltage drop from the gate to source of the first negative-channel MOSFET 208 and the voltage drop across the second negative-channel MOSFET 212 (e.g., $V_{CLAMP}=V_{REF}+V_{SG,\,210}+V_{212}$). If the diode 906 is disabled (e.g., abruptly disabled), one or more devices coupled to the third voltage node $V_{INT}$ may experience transient voltage and current events that may damage and/or destroy the diode 906 and/or the one or more devices coupled to the third voltage node $V_{INT}$. Therefore, it is advantageous to clamp the voltage level at that controls the diode 906 to prevent damage to circuitry and/or one or more devices.

In one example, the parasitic PNP BJT 214 sets a limit for the voltage level at the fifth voltage node $V_{CLAMP}$, the limit to prevent the voltage level at the fifth voltage node $V_{CLAMP}$ from operating above the limit. For example, the voltage level at the fifth voltage node $V_{CLAMP}$ tracks the voltage level at the second voltage node $V_{OUT\_H}$ and when the voltage level at the second voltage node $V_{OUT\_H}$ is above a threshold value, the parasitic PNP BJT 214 clamps the voltage level at the fifth voltage node $V_{CLAMP}$ to a voltage level defined by the voltage drop across the back-gate-to-drain diode of the parasitic PNP BJT 214. For example, the voltage level at the drain of the second negative-channel MOSFET 212 is equal to the voltage level at the fifth voltage node $V_{CLAMP}$ (e.g., 12 volts (V)) minus the drain-to-source voltage drop of the second negative-channel MOSFET 212 (e.g., 3 V). In this example, the parasitic PNP BJT 214 clamps the voltage level at the fifth voltage node $V_{CLAMP}$ to the voltage level at the drain of the second negative-channel MOSFET 212 (e.g., 9 V) plus the voltage drop across the parasitic back-gate-to-drain diode of the parasitic PNP BJT 214 included in the second negative-channel MOSFET 212 (e.g., 0.7 V).

In such an example, the parasitic PNP BJT 214 clamps the voltage at the fifth voltage node $V_{CLAMP}$ by drawing a current (e.g., the fifth current $I_Y$) from the fifth voltage node $V_{CLAMP}$. When the voltage level at the second voltage node $V_{OUT\_H}$ is below a threshold value, the parasitic PNP BJT 214 does not draw current (e.g., the fifth current $I_Y$) from the fifth voltage node $V_{CLAMP}$. However, when the voltage level at the second voltage node $V_{OUT\_H}$ is above a threshold value, the parasitic PNP BJT 214 draws current (e.g., the fifth current $I_Y$) from the fifth voltage node $V_{CLAMP}$.

In the illustrated example of FIG. 9, the current sensor 802 is implemented by the third negative-channel MOSFET 902. The third negative-channel MOSFET 902 includes a fifth source (e.g., a current terminal), a fifth gate, and a fifth drain (e.g., a current terminal). In the example, the fifth source of the third negative-channel MOSFET 902 is coupled to the sixth voltage node GND. In the example, the fifth gate of the third negative-channel MOSFET 902 is coupled to the fifth drain of the third negative-channel MOSFET 902 and the fifth drain of the third negative-channel MOSFET 902 is coupled to the third drain of the second positive-channel MOSFET 210. In the example, the example third negative-channel MOSFET 902 senses the fourth current $I_X$ flowing between the example voltage follower 104 and the current sensor 802. The third current $I_A$ is equal to the fifth current $I_Y$ plus the sixth current $I_{SUB}$ (e.g., $I_X=I_Y+I_{SUB}=I_Y+\beta^*I_Y=(1+\beta)^*I_Y$). The fourth current $I_X$ is equal to the fifth current $I_Y$ (e.g., $I_X=I_Y$).

In the illustrated example of FIG. 9, the current multiplier 804 is implemented by the fourth negative-channel MOSFET 904. The fourth negative-channel MOSFET 904 includes a sixth source (e.g., a current terminal), a sixth gate, and a sixth drain (e.g., a current terminal). In the example, the sixth drain of the fourth negative-channel MOSFET 904 is coupled to the fifth voltage node $V_{CLAMP}$. In the example, the sixth gate of the fourth negative-channel MOSFET 904 is coupled to the fifth gate of the third negative-channel MOSFET 902 and the sixth source of the fourth negative-channel MOSFET 904 is coupled to the sixth voltage node GND. In the example, the fourth negative-channel MOSFET 904 draws a current (e.g., a seventh current $I_N$) proportional by a ratio (1:N) to the sensed current (e.g., the fourth current $I_X$) (e.g., $IN=N^*I_X$). In the illustrated example, the current multiplier 804 is to draw a current (e.g., the seventh current $I_N$), the current (e.g., the seventh current $I_N$) to reduce a leakage current through the parasitic PNP BJT 214. For example, the leakage current is undesired current flowing from the drain of the second negative-channel MOSFET 212 to the sixth voltage node GND. Together, the third negative-channel MOSFET 902 and the fourth negative-channel MOSFET 904 make up a MOSFET current mirror. Moreover, the current flowing between the example drain of the second negative-channel MOSFET 212 and the sixth voltage node GND is reduced by the seventh current $I_N$ caused by the fourth negative-channel MOSFET 904. In the illustrated example, the ratio governing the proportional relationship between the fourth current $I_X$ and the seventh current $I_N$ (e.g., 1:N) is based on the size of the third negative-channel MOSFET 902 and the fourth negative-channel MOSFET 904. In the example, the ratio (1:N) may be based on the channel width of the negative-channel MOSFET transistor used for the third negative-channel MOSFET 902 and the channel width of the fourth negative-channel MOSFET 904. In the example the channel width of the fourth negative-channel MOSFET 904 is N times larger than the channel width of the third negative-channel MOSFET 902.

In the illustrated example of FIG. 9, when the voltage level at the second voltage node $V_{OUT\_H}$ is above a threshold value, the clamper 106 is active. In examples where the clamper 106 is active, the parasitic PNP BJT 214 draws the fifth current $I_Y$ from the fifth voltage node $V_{CLAMP}$ via the base of the parasitic PNP BJT 214. In such an example, the fifth current $I_Y$ is equal to the third current $I_A$ minus the sixth current $I_{SUB}$ (e.g., $I_Y=I_A-I_{SUB}=I_B-I_{SUB}$). Therefore, the current source 110 $I_B$ is equal to the fifth current $I_Y$ plus the sixth current $I_{SUB}$ (e.g., $I_B=I_Y+I_{SUB}=I_Y+\beta^*I_Y=(1+\beta)^*I_Y$).

In the illustrated example of FIG. 9, the current source 110 $I_B$ is a current source that sources the current flowing from the fifth voltage node $V_{CLAMP}$ to the sixth voltage node GND via the parasitic PNP BJT 214 and the third negative-channel MOSFET 902. In other words, the current source 110 $I_B$ is sources the third current $I_A$ and the fifth current $I_Y$. In some examples the current source 110 $I_B$ is a portion of a current mirror. In other examples, the current source 110 $I_B$ is implemented as a constant current diode, a Zener diode current source, an operation amplifier current source, a voltage regulator current source, or any other type of suitable current source.

In the example of FIG. 9, when the clamper 106 is clamping, the current source 110 $I_B$ is sources the fifth current $I_Y$ and the seventh current $I_N$. As the current sourced by the current source 110 $I_B$ increases, the seventh current $I_N$ draws the majority of the current from the current source 110 $I_B$ as shown in equations 6, 7, and 8 below.

$$I_B = I_Y + I_{SUB} + I_N = (1+\beta)*I_X + N*I_X = (1+\beta+N)*I_X \quad \text{Equation-6}$$

$$I_Y = \frac{I_{SUB}}{\beta} = I_X \quad \text{Equation-7}$$

$$I_{SUB} = \frac{\beta*I_B}{(1+\beta+N)} \quad \text{Equation-8}$$

As shown in equation 8, the sixth current $I_{SUB}$ does not draw the majority of the current sourced by the current source 110 $I_B$ due to the proportional ratio between the fourth current $I_X$ and the seventh current $I_N$. Because of the current sensor 802 and the current multiplier 804, more specifically, the third negative-channel MOSFET 902 and the fourth negative-channel MOSFET 904, respectively, the leakage current caused by the parasitic PNP BJT 214 is reduced. In examples where the gain factor, β, of the parasitic PNP BJT 214 is large (e.g., β>>1), the leakage current through the parasitic PNP BJT 214 is reduced significantly such that the leakage current is almost completely attenuated. In examples where the gain factor, β, of the parasitic PNP BJT 214 is small (e.g., 0>β>1), the leakage current through the parasitic PNP BJT 214 is still reduced by a factor of (1+N).

Figure 10:
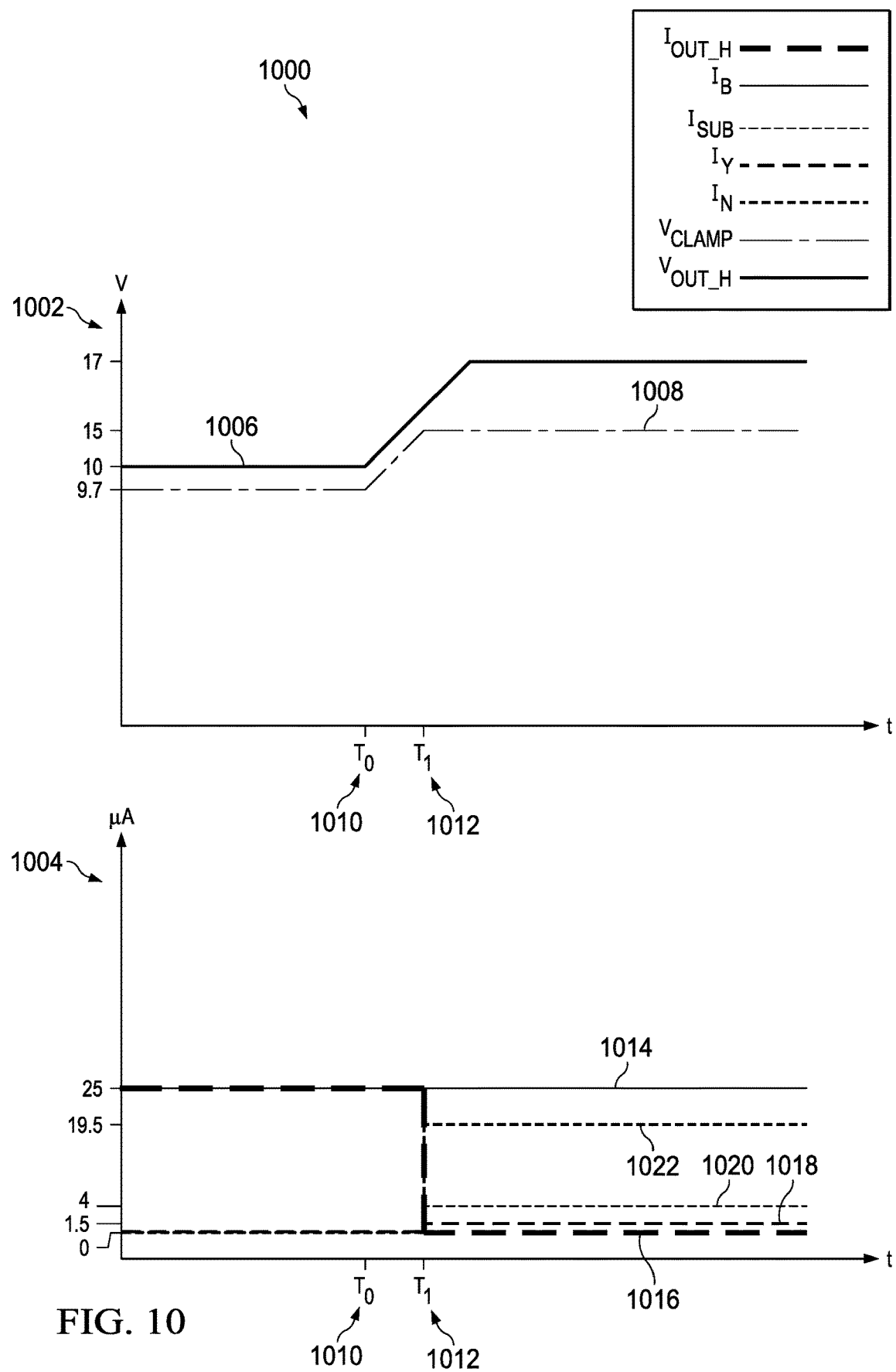
FIG. 10 is a graphical illustration of various voltage levels and current level versus time associated with the example clamping circuit of FIG. 9.

FIG. 10 is a graphical illustration of various voltage levels and current level versus time associated with the example component level clamping circuit 900 of FIG. 9. FIG. 10 includes a voltage plot 1002 and a current plot 1004. The voltage plot 1002 illustrates various voltages levels versus time in the component level clamping circuit 900 versus time. The voltage plot 1002 includes a first curve 1006, a second curve 1008, a first time 1010 ($T_0$), and a second time 1012 ($T_1$). The first curve 1006 represents the voltage level at the second voltage node $V_{OUT\_H}$ of the component level clamping circuit 900. The second curve 1008 represents the voltage level at the fifth voltage plot $V_{CLAMP}$ of the component level clamping circuit 900. The first time 1010 $T_0$ represents a time at which the voltage level at the second voltage node $V_{OUT\_H}$ begins to increase from its current voltage level. The second time 1012 $T_1$ represents a time at which the voltage level at the fifth voltage node $V_{CLAMP}$ reaches a threshold value.

The current plot 1004 illustrates various current levels versus time in the component level clamping circuit 900 versus time. The current plot 1004 includes a third curve 1014, a fourth curve 1016, a fifth curve 1018, a sixth curve 1020, a seventh curve 1022, the first time 1010 $T_0$, and the second time 1012 $T_1$. The third curve 1014 represents the current source 110 $I_B$. The fourth curve 1016 represents the first current $I_{OUT\_H}$. The fifth curve 1018 represents the fifth current $I_Y$. The sixth curve 1020 represents the sixth current $I_{SUB}$. The seventh curve 1022 represents the seventh current $I_N$.

In the illustrated example of FIG. 10, before the first time 1010 $T_0$, the example first curve 1006 is at a voltage level of 10 V, the example second curve 1008 is at a voltage level of 9.7 V, the example third curve 1014 is at a current level of 25 μA, the example fourth curve 1016 is at a current level of 25 μA, the example fifth curve 1018 is at a current level of 0 μA, the example sixth curve 1020 is at a current level of 0 μA, and the example seventh curve 1022 is at a current level of 0 μA. At the first time 1010 $T_0$, the example first curve 1006 begins to transition from a voltage level of 10 V to a voltage level of 17 V and the example second curve 1008 begins to transition from a voltage level of 9.7 V to a voltage level of 15 V.

At the second time 1012 $T_1$, the example clamper 106 clamps the voltage level at the fifth voltage node $V_{CLAMP}$ to a threshold value. At the second time 1012 $T_1$, the example first curve 1006 continues to transition from 10 V to 17 V. At the second time 1012 $T_1$, the voltage level of the example first curve 1006 is 15.7 V. At the second time 1012 $T_1$, the example second curve 1008 is at a voltage level of 15 V, the example third curve 1014 is at a current level of 25 μA, the example fourth curve 1016 begins to transition from a current of 25 μA to a current level of 0 μA, the example fifth current curve 1018 begins to transition from a current level of 0 μA to a current level of 1.5 μA, the example sixth curve 1020 begins to transition from a current level of 0 μA to a current level of 4 μA, and the example seventh curve 1022 begins to transition from a current level of 0 μA to a current level of 19.5 μA.

After the second time 1012 $T_1$, the clamper 106 continues to clamp the voltage level at the fifth voltage node $V_{CLAMP}$ to the threshold value. After the second time 1012 $T_1$, the example first curve 1006 continues to transition from a voltage level of 10 V to a voltage level of 17 V and maintains a voltage level of 17 V, the example second curve 1008 maintains a voltage level of 15 V, the example third curve 1014 maintains a current level of 25 μA, the example fourth curve 1016 maintains a current level of 0 μA, the example fifth curve 1018 maintains a current level of 1.5 μA, the example sixth curve 1020 maintains a current level of 4 μA, and the example seventh curve 1022 maintains a current level of 19.5 μA.

In such an example as illustrated in FIG. 10, the current drawn from the fifth voltage node $V_{CLAMP}$ by the example current multiplier 804 (e.g., the example fourth negative-channel MOSFET 904) draws the majority of the current sourced by the current source 110 $I_B$. The current level of the sixth current $I_{SUB}$ is sufficiently low (e.g., 4 μA) to prevent the second negative-channel MOSFET 212 from experiencing a latch-up event. Thus, the seventh current $I_N$ drawn by the example current multiplier 804 (e.g., the example fourth negative-channel MOSFET 904) prevents latch-up events that can damage and/or destroy the second negative-channel MOSFET 212 and/or one or more devices or circuitry coupled to the second voltage node $V_{OUT\_H}$ and the third voltage node $V_{INT}$.

While an example manner of implementing the current clamping circuit 500 of FIG. 5 and the current clamping circuit 800 of FIG. 8 is illustrated in FIG. 6 and FIG. 9, respectively, one or more of the elements, processes and/or devices illustrated in FIGS. 6 and 8 may be combined, divided, re-arranged, omitted, eliminated and/or implemented in any other way. Further, the example current sensor 602, the example current multiplier 604, the example current sensor 802, and/or the example current multiplier 804 of FIG. 6 and FIG. 8 respectively may be implemented by hardware, software, firmware and/or any combination of hardware, software and/or firmware. Thus, for example, any of the example current sensor 602, the example current multiplier 604, the example current sensor 802, and/or the example current multiplier 804 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example current sensor 602, the example current multiplier 604, the example current sensor 802, and/or the example current multiplier 804 is/are hereby expressly defined to include a non-transitory computer readable storage device or storage disk such as a memory, a digital versatile disk (DVD), a compact disk (CD), a Blu-ray disk, etc. including the software and/or firmware. Further still, the example clamping circuit 500 of FIG. 5 and/or the example clamping circuit 800 of FIG. 8 may include one or more elements, processes and/or devices in addition to, or instead of, those illustrated in FIG. 5 and FIG. 8 respectively, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As mentioned above, the example processes of FIGS. 5 and 8 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one of B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least A, (2) at least B, and (3) at least A and at least B. Similarly, as used herein in the context of describing the performance or execution of processes, instructions, actions, activities and/or steps, the phrase "at least one of A or B" is intended to refer to implementations including any of (1) at least A, (2) at least B, and (3) at least A and at least B.

Figure 11:
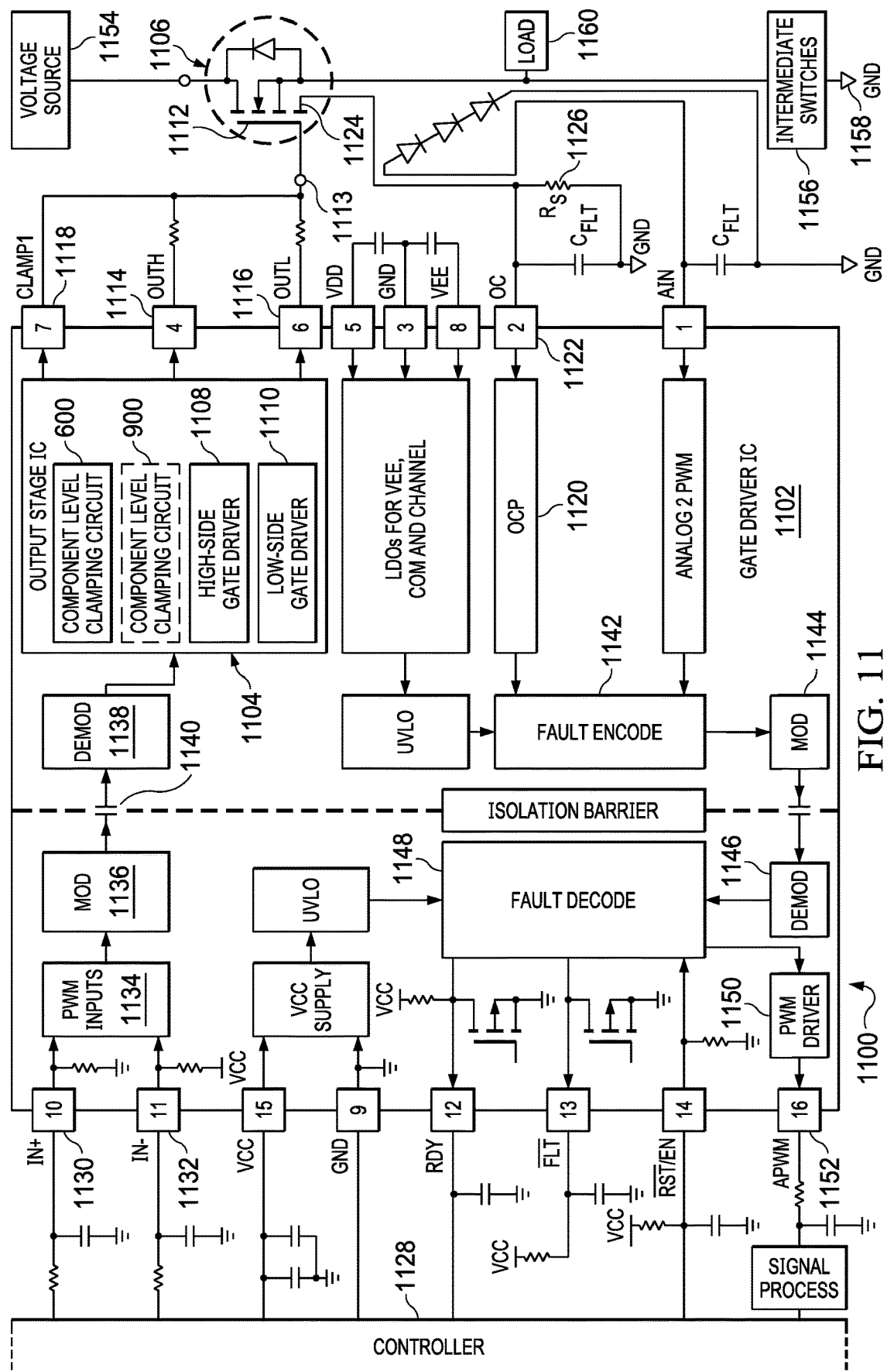
FIG. 11 is a schematic diagram of an example gate driver system including the example clamping circuit of FIG. 6.

FIG. 11 is a schematic diagram of an example gate driver system 1100 including the example component level clamping circuit 600 of FIG. 6 and/or the example component level clamping circuit 900 of FIG. 9. The gate driver system 1100 is a high-voltage (e.g., 800 Volt (V) rating) isolated gate driver system (e.g., a power delivery system) that can provide power to a high-voltage and/or a high-current load. For example, the gate driver system 1100 may be used to provide power to an electric motor, a traction inverter, or any other type of electrical device included in an EV, an HEV, etc. Alternatively, the gate driver system 1100 may be used to provide power to any other electrical device or load. In FIG. 11, the gate driver IC 1102 is a power delivery circuit. For example, the gate driver IC 1102 is to be coupled to the switch 1106 to control and/or otherwise facilitate switching operations of the switch 1106. In such examples, the gate driver IC 1102 may turn on the switch 1106 to provide power to a load. In other examples, the gate driver IC 1102 may turn off the switch 1106 in two or more stages to remove power from the load.

The output stage IC 1104 of FIG. 11 is hardware. Alternatively, the output stage IC 1104 may be implemented using hardware logic, machine readable instructions, hardware implemented state machines, etc., and/or a combination thereof. For example, the output stage IC 1104 may be a controller that includes and/or can access machine readable instructions. In such examples, the output stage IC 1104 can execute machine readable instructions to turn off the switch 1106 with two or more turn-off stages, steps, operations, etc.

In the illustrated example of FIG. 11, the output stage IC 1104 includes the example component level clamping circuit 600 to clamp the voltage level at a voltage node to protect one or more devices and/or circuitry coupled to the voltage node $V_{OUT\_H}$ and/or the internal circuitry of the output stage IC 1104. The output stage IC 1104 additionally includes an example high-side (HS) gate driver 1108 to turn on the switch 1106 and an example low-side (LS) gate driver 1110 to turn off the switch 1106. Alternatively, the output stage IC 1104 may include fewer or more than the quantity of gate drivers depicted in FIG. 2. For instance, in some examples, the output stage IC 1104 includes the example component level clamping circuit 900 as opposed to the example component level clamping circuit 600.

In the illustrated example of FIG. 11, the switch 1106 is a SiC MOSFET. Alternatively, the switch 1106 may be a MOSFET made from any other material (e.g., Si, GaAs, etc.). Alternatively, the switch 1106 may be any other power switching device such as an IGBT. In FIG. 11, the switch 1106 includes an example gate 1112. The example gate 1112 of the switch 1106 is coupled to the output stage IC 1104 via one or more example IC pins of the gate driver IC 1102. Alternatively, the gate 1112 may be coupled to the gate driver IC 1102 via one or more intervening connections, vias, nodes, etc. In some examples, the gate 1112 is to be coupled to the gate driver IC 1102 via the one or more IC pins. For example, the gate driver IC 1102 may be a first IC and the switch 1106 may be included in a second IC, where the first and second ICs are separately manufactured and can be coupled after manufacturing. In such examples, the gate driver IC 1102 and the switch 1106 are separate devices and may not be packaged and/or otherwise assembled together prior to being received by an end user. For example, the end user may separately obtain the gate driver IC 1102 and the switch 1106 and couple the gate driver IC 1102 to the switch 1106 as depicted in FIG. 11 after separately obtaining the devices.

In the illustrated example of FIG. 11, the gate 1112 is coupled to an example first IC pin 1114 at an example output node 1113. Alternatively, the gate 1112 is to be coupled to the first IC pin 1114. The first IC pin 1114 is pin 4 (OUTH) of the gate driver IC 1102. The first IC pin 1114 corresponds to an output (e.g., a high output) of the HS gate driver 1108. For example, the HS gate driver 1108 may generate an output signal corresponding to a current, a voltage, etc., that turns on the switch 1106 by pulling up the gate voltage of the gate 1112 above a threshold voltage (VTH).

In FIG. 11, the gate 1112 is coupled to an example second IC pin 1116 at the output node 1113. Alternatively, the gate 1112 is to be coupled to the second IC pin 1116. The second IC pin 1116 is pin 6 (OUTL) of the gate driver IC 1102. The second IC pin 1116 corresponds to an output (e.g., a low output) of at least the LS gate driver 1110. For example, the LS gate driver 1110 may generate an output signal corresponding to a current, a voltage, etc., that turns off the switch 1106 by pulling down the gate 1112 below the threshold voltage.

In FIG. 11, the gate 1112 is coupled to an example third IC pin 1118 at the output node 1113. Alternatively, the gate 1112 is to be coupled to the third IC pin 1118. The third IC pin 1118 is pin 7 (CLAMP) of the gate driver IC 1102. The third IC pin 1118 corresponds to an additional output of the output stage IC 1104.

In the illustrated example of FIG. 11, the gate driver IC 1102 detects an over-current condition associated with the switch 1106 by measuring a current flowing through the switch 1106. In FIG. 11, the gate driver IC 1102 includes an example over-current protection (OCP) IC 1120 to detect the over-current condition. The OCP IC 1120 obtains a voltage corresponding to the current flowing through the switch 1106 via an example fourth IC pin 1122. The fourth IC pin 1122 is pin 2 (OC) of the gate driver IC 1102. The fourth IC pin 1122 corresponds to an over-current measurement associated with the switch 1106.

In the illustrated example of FIG. 11, an example sense terminal 1124 of the switch 1106 is coupled to the fourth IC pin 1122. Alternatively, the sense terminal 1124 is to be coupled to the fourth IC pin 1122. In operation, a current flowing through the sense terminal 1124 generates a voltage across an example sense resistor 1126. In FIG. 11, the sense resistor 1126 is coupled to the fourth IC pin 1122 and the sense terminal 1124. Alternatively, the sense resistor 1126 is to be coupled to the fourth IC pin 1122 and/or the sense terminal 1124. The OCP IC 1120 obtains the voltage via the fourth IC pin 1122 and compares the voltage to an over-current threshold. For example, the over-current threshold is a voltage that corresponds to a current above which corrective action is to be taken by the gate driver IC 1102 to protect the switch 1106. In such examples, the corrective action can correspond to triggering a multiple-level turn off operation via one or more ICs including at least the LS gate driver 1110.

In the illustrated example of FIG. 11, the gate driver system 1100 includes an example controller 1128 to control and/or otherwise manage switch operations of the switch 1106 via the gate driver IC 1102. Alternatively, the controller 1128 may be included in the gate driver IC 1102. In FIG. 11, the controller 1128 is an IC. Alternatively, the controller 1128 may be implemented using hardware logic, machine readable instructions, hardware implemented state machines, etc., and/or a combination thereof.

In the illustrated example of FIG. 11, the controller 1128 generates example signals (e.g., current signals) that are converted to example input voltages. The input voltages include a first example input voltage (IN+) that is obtained by the gate driver IC 1102 at an example fifth IC pin 1130. The fifth IC pin 1130 is pin 10 of the gate driver IC 1102. The input voltages include a second example input voltage (IN−) that is obtained by the gate driver IC 1102 at an example sixth IC pin 1132. The sixth IC pin 1132 is pin 11 of the gate driver IC 1102. The input voltages are converted to PWM signals by an example PWM input IC 1134.

In the illustrated example of FIG. 11, the PWM input IC 1134 generates and transmits the PWM signals to a first example modulator (MOD) IC 1136 that modulates the PWM signals. The first MOD IC 1136 transmits the modulated PWM signals to a first example demodulator (DE-MOD) IC 1138 that demodulates the PWM signals. The first MOD IC 1136 transmits the modulated PWM signals to the first DEMOD IC 1138 through an example isolation barrier 1140. For example, the isolation barrier 1140 is a capacitive isolation barrier. In such an example the isolation barrier 1140 is implemented by one or more capacitors. In other examples, the isolation barrier 1140 is an opto-isolator, a Hall effect isolation barrier, a magneto-coupler, or any other type of isolation barrier suitable to the application. The first DEMOD IC 1138 transmits the demodulated PWM signals to the output stage IC 1104. The output stage IC 1104 processes the demodulated PWM signals from the first DEMOD IC 1138 to facilitate operation of at least one of the HS gate driver 1108, the LS gate driver 1110, or the component level clamping circuit 600. For example, the controller 1128 may generate one or more control signals to operate at least one of the HS gate driver 1108, the LS gate driver 1110, or the component level clamping circuit 600. In some examples, the output stage IC 1104 processes the demodulated PWM signal from the first DEMOD IC 1138 to facilitate operation of at least one of the HS gate driver 1108, the LS gate driver 1110, or the component level clamping circuit 900. In such examples, the controller 1128 may generate one or more control signals to operate at least one of the HS gate driver 1108, the LS gate driver 1110, or the component level clamping circuit 900.

In the illustrated example of FIG. 11, the controller 1128 obtains a signal (e.g., a fault signal, an over-current indicator, etc.) from the OCP IC 1120 when an over-current condition is detected. In FIG. 11, in response to detecting the over-current condition associated with the switch 1106, the OCP IC 1120 asserts a logic High to an example fault encode IC 1142. Alternatively, the OCP IC 1120 may generate a logic Low (e.g., a signal corresponding to a digital zero) to the fault encode IC 1142 when the over-current condition is detected. The fault encode IC 1142 generates and transmits a fault signal to a second example modulator (MOD) IC 1144. In some examples, the fault signal from the fault encode IC 1142 corresponds to an indication that the over-current condition is detected. In some examples, the fault signal from the fault encode IC 1142 corresponds to a measurement (e.g., a voltage, a current, etc., obtained at the fourth IC pin 1122) associated with the over-current condition.

In the illustrated example of FIG. 11, the second MOD IC 1144 modulates the fault signal from the fault encode IC 1142 and transmits the modulated fault signal to a second example demodulator (DEMOD) IC 1146 through the isolation barrier 1140. The second DEMOD IC 1146 demodulates the modulated fault signal from the second MOD IC 1144 and transmits the demodulated fault signal to an example fault decode IC 1148. The fault decode IC 1148 decodes the fault signal to determine that an over-current condition has been detected. In response to determining the over-current condition associated with the switch 1106, the fault decode IC 1148 generates and transmits a signal (e.g., an alarm, an alert, a fault indicator, etc.) to an example PWM driver IC 1150. The PWM driver IC 1150 generates PWM signals based on the fault indicator signal from the fault decode IC 1148. The PWM driver IC 1150 transmits the PWM signals to the controller 1128 via an example seventh IC pin 1152. The seventh IC pin 1152 is pin 16 of the gate driver IC 1102. In response to obtaining the PWM signals, the controller 1128 determines that the over-current condition has been detected. In some examples, in response to the determination, the controller 1128 generates and transmits signals to the PWM input IC 1134 to operate at least one of the HS gate driver 1108, the LS gate driver 1110, the component level clamping circuit 600, or the component level clamping circuit 900.

By turning on the switch 1106, gate driver IC 1102 provides power to an example load 1160. For example, the load 1160 can be an electric motor, a traction inverter, or any other type of electrical device included in an EV, an HEV, etc. Alternatively, the load 1160 may be a battery, a power converter such as a half-bridge power converter (e.g., a boost converter, a buck converter, a buck-boost converter, etc.), etc. In FIG. 11, an example voltage source 1154 is coupled to the switch 1106. The voltage source 1154 is a battery. Alternatively, the voltage source 1154 may be a capacitor, a direct current (DC) voltage source, etc. In FIG. 11, the switch 1106 provides power to the load 1160. For example, the switch 1106 can provide a voltage in a range of 400-1000 V, a current in a range of 100-1000 A, etc., and/or a combination thereof to the load 1160. In FIG. 11, there may be example one or more intermediate switches 1156 coupled between the load and an example ground node 1158 (GND). The one or more intermediate switches 1156 may be controlled by the controller 1128 or any suitable external or internal controller.

In some examples disclosed herein, a hardware processor (e.g., the controller 1128) may be used to execute the instructions to implement the controller 1128 of FIG. 11. The hardware processor can be, for example, a server, an electronic control unit (ECU) of a vehicle, a personal computer, a workstation, or any other type of computing device. The hardware processor may be a semiconductor based (e.g., silicon based) device. For example, the hardware processor may obtain a measurement (e.g., a current measurement, a voltage measurement, etc.) associated with the switch 1106 of FIG. 11, and/or generate a control signal that is to be obtained by the gate driver IC 1102 of FIG. 11. In such examples, the hardware processor can generate a control signal that is to be obtained by the output stage IC 1104 of the gate driver IC 1102 to turn on or off the one or more switches to provide power or remove power from the load 1160 of FIG. 11. For example, the hardware processor may direct and/or otherwise cause the output stage IC 1104, or more specially one of the component level clamping circuit 600 or the component level clamping circuit 900 to clamp the voltage level at a voltage node to protect one or more devices and/or circuitry coupled to the voltage node $V_{OUT\_H}$ and/or the internal circuitry of the output stage IC 1104 to ensure that the output stage IC can control the switch 1106.

Collectively, the output stage IC 1104, the first IC pin 1114, the second IC pin 1116, the third IC pin 1118, the fourth IC pin 1122, the OCP IC 1120, the fault encode IC 1142, the second MOD IC 1144, and the first DEMOD IC 1138 form a high voltage element in the gate driver IC 1102. Collectively, the fifth IC pin 1130, the sixth IC pin 1132, the seventh IC pin 1152, the PWM input IC 1134, the first MOD IC 1136, the second DEMOD IC 1146, the fault decode IC 1148, and the PWM driver IC 1150 form a low voltage element in the gate driver IC 1102. The high voltage element in the gate driver IC 1102 is separated from the low voltage element in the gate driver IC 1102 by the isolation barrier 1140. In examples disclosed herein, the gate driver IC 1102 is implemented in an integrated chip.

In some examples disclosed herein, the low voltage element is implemented on a first die (e.g., a silicon die) within the gate driver IC 1102. Additionally, in some examples disclosed herein, the high voltage element is implemented on a second die (e.g., a silicon die) separate from the low voltage element, within the gate driver IC 1102. In other examples disclosed herein, the low voltage element and high voltage element may be implemented on a single die (e.g., a silicon die) within the gate driver IC 1102. In other examples disclosed herein, the voltage element may be implemented on a plurality of dies (e.g., silicon dies) within the gate driver IC 1102. In other examples, the high voltage element may be implemented on a plurality of dies (e.g., silicon dies) within the gate driver IC 1102. Alternatively, in other examples disclosed herein, the gate driver IC 1102 and/or any of the components shown in the gate driver IC 1102 may be implemented on a plurality of integrated circuits.

From the foregoing, it will be appreciated that example methods, apparatus and articles of manufacture have been disclosed that reduce leakage current through parasitic components without the need of gain reduction through manufacturing or the use of guard rings. The examples disclosed herein protect one or more components, devices, and/or circuits from experiencing latch-up events. The examples disclosed herein prevent damage and/or destruction of components, devices, and/or circuits where parasitic components are present. The disclosed methods, apparatus and articles of manufacture improve the efficiency of using a computing device by reducing the power consumed by the computing device in which the disclosed methods, apparatus, and articles of manufacture are implemented. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
  a first transistor having a first control terminal, a first current terminal, and a second current terminal;

a second transistor having a second control terminal, a third current terminal, and a fourth current terminal;
the first current terminal coupled to the third current terminal;
the first control terminal coupled to the second control terminal and to the second current terminal;
a third transistor having a third control terminal, a fifth current terminal, and a sixth current terminal, the fifth current terminal coupled to the second current terminal, the third control terminal coupled to a voltage reference terminal; and
a fourth transistor having a fourth control terminal, a seventh current terminal, and an eighth current terminal, the seventh current terminal coupled to the sixth current terminal, the fourth control terminal coupled to the seventh current terminal, and the eighth current terminal coupled to the fourth current terminal.

2. The apparatus of claim 1, wherein the first current terminal and the third current terminal are coupled to a first voltage supply terminal.

3. The apparatus of claim 1, wherein the eighth current terminal is coupled to a current source.

4. The apparatus of claim 1, wherein the fourth current terminal and the eighth current terminal are coupled to a second voltage supply terminal and a fifth control terminal of a fifth transistor, the fifth transistor having a ninth current terminal coupled to a resistor, the resistor coupled to the fifth control terminal, and a tenth current terminal adapted to be coupled to a sixth control terminal of a sixth transistor.

5. The apparatus of claim 4, wherein the first current terminal is a first source, the third current terminal is a second source, the sixth current terminal is a third source, the seventh current terminal is a fourth source, the ninth current terminal is a fifth source, the second current terminal is a first drain, the fourth current terminal is a second drain, the fifth current terminal is a third drain, the eighth current terminal is a fourth drain, and the tenth current terminal is a fifth drain.

6. The apparatus of claim 4, wherein the first transistor comprises a first positive-channel metal oxide semiconductor field effect transistor (MOSFET), the second transistor comprises a second positive-channel MOSFET, the third transistor comprises a first negative-channel MOSFET, the fourth transistor comprises a second negative-channel MOSFET, and the fifth transistor comprises a third positive-channel MOSFET.

7. The apparatus of claim 4, wherein the sixth current terminal is coupled to the eighth current terminal, and the fourth control terminal is coupled to the seventh current terminal and to an eleventh current terminal of a diode.

8. An apparatus comprising:
a clamper comprising a transistor, the damper configured to clamp a first voltage supply terminal to a voltage level;
a current sensor coupled to the clamper, the current sensor configured to sense a first current; and
a current multiplier coupled to the current sensor and to the damper, the current multiplier configured to generate a second current proportional to the first current, the second current configured to reduce a third current flowing from the transistor to a ground terminal.

9. The apparatus of claim 8, wherein the transistor comprises a negative-channel metal oxide semiconductor field effect transistor (MOSFET) and a parasitic transistor, wherein the parasitic transistor comprises a positive-negative-positive (PNP) bipolar junction transistor (BJT), wherein the current sensor comprises a positive-channel MOSFET, and wherein the current multiplier comprises a second positive-channel MOSFET.

10. The apparatus of claim 8, wherein the transistor comprises a second negative-channel MOSFET and a parasitic transistor, wherein the parasitic transistor comprises a PNP BJT, wherein the current sensor comprises a third negative-channel MOSFET, and wherein the current multiplier comprises a fourth negative-channel MOSFET.

11. The apparatus of claim 8, wherein the current sensor is coupled to the damper via a voltage follower, the voltage follower comprising a third positive-channel MOSFET and a fifth negative-channel MOSFET.

12. The apparatus of claim 8, wherein the voltage supply terminal is a first voltage supply terminal, the apparatus further comprising a voltage-controlled switch coupled to the first voltage supply terminal, and the voltage-controlled switch configured to be coupled to a second voltage supply terminal.

13. The apparatus of claim 12, wherein the voltage-controlled switch comprises:
a fourth positive-channel MOSFET comprising a source, a drain, and a control terminal;
a resistor coupled to the source and to the control terminal of the fourth positive-channel MOSFET, the control terminal of the fourth positive-channel MOSFET coupled to the first voltage supply terminal; and
a parasitic diode coupled to the drain and to the source of the fourth positive-channel MOSFET.

14. A system comprising:
a capacitor having a first terminal and a second terminal;
a low voltage element coupled to the first terminal of the capacitor;
a high voltage element coupled to the second terminal of the capacitor, the high voltage element comprising a damper, a current sensor, and a current multiplier;
the clamper comprising a transistor, the damper configured to clamp a voltage supply terminal to a voltage level;
the current sensor coupled to the damper, the current sensor configured to sense a first current; and
the current multiplier coupled to the current sensor and to the clamper, the current multiplier configured to generate a second current proportional to the first current, the second current configured to reduce a third current flowing from the transistor to a ground terminal.

15. The system of claim 14, wherein the transistor comprises a negative-channel metal oxide semiconductor field effect transistor (MOSFET) and a parasitic transistor, wherein the parasitic transistor comprises a positive-negative-positive (PNP) bipolar junction transistor (BJT), wherein the current sensor comprises a first positive-channel MOSFET, and wherein the current multiplier comprises a second positive-channel MOSFET.

16. The system of claim 14, wherein the transistor comprises a negative-channel MOSFET and a parasitic transistor, wherein the parasitic transistor comprises a PNP BJT, wherein the current sensor comprises a third negative-channel MOSFET, and wherein the current multiplier comprises a fourth negative-channel MOSFET.

17. The system of claim 14, wherein the current sensor is coupled to the damper via a voltage follower, the voltage follower comprising a third positive-channel MOSFET and a fifth negative-channel MOSFET.

18. The system of claim 14, wherein the voltage supply terminal is a first voltage supply terminal and the voltage level is a first voltage level, the system further comprising a voltage-controlled switch coupled to a second voltage supply terminal, the voltage-controlled switch to protect one or more circuits coupled to the second voltage supply terminal from operating below a second voltage level, the one or more circuits in the high voltage element.

19. The system of claim 18, wherein the voltage-controlled switch comprises:
- a fourth positive-channel MOSFET having a source, a drain, and a control terminal;
- a resistor coupled to the source of the fourth positive-channel MOSFET and to the control terminal of the fourth positive-channel MOSFET, the control terminal of the fourth positive- channel MOSFET coupled to the first voltage supply terminal; and
- a parasitic diode coupled to the drain of the fourth positive-channel MOSFET and to the source of the fourth positive-channel MOSFET.

20. The system of claim 19, wherein the second voltage level is a function of the first voltage level, the function based on a voltage drop across the voltage-controlled switch.

* * * * *